United States Patent
Sullivan et al.

(10) Patent No.: US 7,282,721 B2
(45) Date of Patent: Oct. 16, 2007

(54) METHOD AND APPARATUS FOR TUNING ION IMPLANTERS

(75) Inventors: Terence Sean Sullivan, Brookline, MA (US); David S. Holbrook, Lexington, MA (US); Clifford A. Lardin, Ithaca, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1332 days.

(21) Appl. No.: 09/943,625

(22) Filed: Aug. 30, 2001

(65) Prior Publication Data

US 2003/0042427 A1 Mar. 6, 2003

(51) Int. Cl.
*H01J 37/317* (2006.01)
(52) U.S. Cl. .............................. 250/396 R; 250/492.21
(58) Field of Classification Search ............ 250/396 R, 250/492.21, 492.2
See application file for complete search history.

(56) References Cited

U.S. PATENT DOCUMENTS 6,774,378 B1 * 8/2004 Huang et al. .......... 250/492.21

FOREIGN PATENT DOCUMENTS

| EP | 0986091 A2 | 3/2000 |
| JP | 10134745 | 5/1998 |
| WO | WO 02/23583 A2 | 3/2002 |

* cited by examiner

Primary Examiner—Kiet T. Nguyen

(57) ABSTRACT

Methods and apparatus are provided for automatically tuning a charged particle beam system, such as an ion implanter. In one embodiment, a control parameter of a control component located upstream of a target component is modulated, and the beam current downstream of the target component is measured. The beam current measurements provide information that is used to evaluate tuning and, if necessary, to adjust the target component. The target component is typically a slow response component, such as a magnet. In another embodiment, evaluation of tuning is performed by modulating the target parameter and monitoring the effect of such modulation on the beam current. In a further embodiment, the spot size of the charged particle beam is evaluated by scanning the beam across the edge of an aperture and evaluating the sharpness of the beam focus. The tuning algorithms are preferably implemented in localized power supply interfaces for high speed operation.

72 Claims, 18 Drawing Sheets

METHOD AND APPARATUS FOR TUNING ION IMPLANTERS

FIELD OF THE INVENTION

The present invention relates to charged particle beam systems and, more particularly, to methods and apparatus for tuning charged particle beam systems, including but not limited to ion implanters.

BACKGROUND OF THE INVENTION

Ion implantation is a standard, commercially-accepted technique for introducing conductivity-altering impurities into semiconductor wafers. In a conventional ion implanter, a desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Exacting requirements are placed on semiconductor fabrication processes involving ion implantation with respect to the cumulative ion dose implanted into the wafer, implant depth, dose uniformity across the wafer surface, surface damage and undesirable contamination. The implanted dose and depth determine the electrical activity of the implanted region, while dose uniformity is required to ensure that all devices on the semiconductor wafer have operating characteristics within specified limits.

To form devices on the semiconductor wafer, it is often necessary to implant impurities at different depths. The energy of the ions in the beam is determinative of the depth to which the ions travel within the semiconductor wafer before lodging in the semiconductor lattice. A given recipe for a particular electronic device may require several ion implantation steps using different ion species, different energies and different doses. Each time one or more parameters of the ion beam are changed, for example when the energy of the ion beam is changed, it is necessary to tune the ion implanter to optimize beam transport and delivery to the wafer.

Tuning a conventional ion implanter is a relatively time consuming process. Initially, a computer controlling the operation of the ion implanter is programmed to retrieve general tuning parameters associated with a new beam profile and to apply those parameters to the ion implanter. Once the various components of the ion implanter are provided with the general tuning parameters regarding the approximate values for the particular beam recipe, an operator optimizes the settings to complete the tuning process. It may take an experienced operator five to thirty minutes or more to manually tune the beam to an acceptable level so that the ion implanter may be used to implant ions in wafers. This relatively long tuning time is necessitated, at least in part, by the fact that one or more components of the ion implanter, such as large magnetic components, may have a relatively long stabilization time and may exhibit hysteresis. Automatic tuning (autotune) techniques have also been utilized. However, prior art autotune techniques have been no faster than manual tuning techniques. Tuning a conventional ion implanter is thus a time consuming task. Since an ion implanter cannot be used to implant ions in wafers until it is tuned, the tuning process represents an obstacle to increasing the throughput of the ion implanter.

Additionally, conventional tuning procedures may require precise knowledge of the strength of the magnetic fields produced by the magnets. Thus, high sensitivity Gauss probes may be used in the tuning process for conventional ion implanters. Unfortunately, high sensitivity Gauss probes are typically very expensive, on the order of tens of thousands of dollars. Accordingly, it would be desirable to eliminate these Gauss probes or to replace them with less expensive, low sensitivity Gauss probes.

Accordingly, there is a need for improved methods and apparatus for tuning charged particle beam systems, including but not limited to ion implanters.

SUMMARY OF THE INVENTION

The present invention overcomes these and other drawbacks by providing methods and apparatus for automatically tuning one or more components of a charged particle beam system, thereby reducing the time required to tune the system and at least partially eliminating the need for human expertise in the tuning process.

According to a first aspect of the invention, a method is provided for evaluating the tuning of a target parameter of a target component in a charged particle beam system, wherein a charged particle beam is transported through the target component. The method comprises the steps of (a) varying a control parameter of a control component located upstream of the target component, wherein the control parameter has a predetermined relation to the target component, (b) measuring beam current downstream of the target component as the control parameter is varied, and (c) evaluating the tuning of the target parameter based on the beam current measurements and the predetermined relation between the target component and the control parameter. If the evaluated tuning does not meet a predetermined criteria, the target parameter may be adjusted. In a preferred embodiment, the charged particle beam system comprises an ion implanter.

The target component may comprise a magnet which generates a magnetic field in response to a magnet current. The step of adjusting the target parameter may comprise adjusting the magnet current. The control component may comprise an electrostatic component which generates an electric field in response to a control voltage. The control component may vary the energy of the charged particle beam or may vary an entry angle of the charged particle beam into the magnet. The step of varying the control parameter may comprise varying the control voltage. The target component is typically a slow response component.

The step of evaluating the tuning of the target parameter may comprise analyzing the beam current measurements to determine a target parameter adjustment. The target parameter may be adjusted by the determined target parameter adjustment. The step of analyzing the beam current measurements may comprise determining a target parameter adjustment direction and magnitude to shift a peak beam current toward a required value of the control parameter.

The method may further comprise the step of performing two or more iterations of steps (a), (b) and (c) followed by adjustment of the target parameter, until the measured beam current meets a predetermined criteria.

According to another aspect of the invention, a method is provided for tuning a target parameter of a target component in a charged particle beam system, wherein a charged particle beam is transported through the target component. The method comprises the steps of (a) determining a nominal target parameter value, wherein the target parameter comprises the approximate value of a power supply output feeding the target component, (b) measuring a nominal readback value of the power supply output, (c) varying the target parameter in a predetermined pattern about the nominal target parameter value, (d) measuring the beam current downstream of the target component in the charged particle beam system, and the target parameter readback value of the power supply output, as the target component is varied, (e) determining an optimal readback value, within the range of values bounded by the extreme members of a set comprising at least one measurement of the target parameter readback value recorded nearly simultaneously with at least one measurement of the beam current at least a predetermined fraction of the peak observed beam current, (f) adjusting the nominal target parameter value by a predetermined function of the signed difference between the nominal readback value and the optimal readback value, and (g) performing two or more iterations of at least steps (b), (c), (d) and (e) until the beam current measurements meet a predetermined criteria.

According to a further aspect of the invention, a method is provided for evaluating the tuning of a target parameter of a target component in a charged particle beam system, wherein a charged particle beam is transported through the target component and the target parameter determines the approximate downstream focus of the charged particle beam. The method comprises the steps of (a) determining a nominal target parameter value, wherein the target parameter determines the approximate position of the charged particle beam at the plane of a beam current sensing device located downstream of the target component, (b) varying the target parameter in a predetermined pattern about the nominal control parameter value, such that the charged particle beam is alternately incident on and not incident on the beam current sensing device, (c) measuring the beam current with the beam current sensing device as the target parameter is varied, (d) determining the sharpness of the transition between the charged particle beam being incident on and not incident on the beam current sensing device, and (e) evaluating the tuning of the target parameter based at least in part on the sharpness of the transition.

According to another aspect of the invention, apparatus is provided for evaluating the tuning of a target parameter of a target component in a charged particle beam system, wherein a charged particle beam is transported through the target component. The apparatus comprises means for varying a control parameter of a control component located upstream of the target component, wherein the control parameter has a predetermined relation to the target component, means for measuring the beam current downstream of the target component as the control parameter is varied, and means for evaluating the tuning of the target parameter based on the beam current measurements and the predetermined relation between the target component and the control parameter.

According to a further aspect of the invention, charged particle beam apparatus is provided. The charged particle beam apparatus comprises a target component controlled by a target parameter, a control component controlled by a control parameter and located upstream of the target component, a beam sensor located downstream of the target component for sensing a charged particle beam transported through the control component and the target component, and a controller for varying the control parameter and evaluating the tuning of the target parameter in response to beam current measurements received from the beam sensor, based on a predetermined relation between the target component and the control parameter.

According to a further aspect of the invention, a charged particle beam system is provided. The charged particle beam system comprises one or more beamline components through which a charged particle beam is transported, a centralized controller for controlling the system, and at least one localized controller containing a tuning algorithm for automatically tuning a selected one of the beamline components in response to a tune command from the centralized controller.

According to a further aspect of the invention, a method is provided for adjusting the focus of a charged particle beam. The method comprises the steps of (a) deflecting the charged particle beam across an edge of an aperture, (b) determining the rate of change of beam current downstream of the aperture as the beam is deflected across the edge of the aperture, (c) repeating steps (a) and (b) for different focus settings of the charged particle beam, and (d) selecting the focus setting which gives the highest rate of change of beam current downstream of the aperture as the beam is deflected across the edge of the aperture.

According to a further aspect of the invention, a tuning method is provided for a charged particle beam system comprising a plurality of beamline components through which a charged particle beam system is transported, a centralized controller and one or more power supply controllers for controlling individual ones of the beamline components. The method comprises the steps of the centralized controller sending a tune command to a selected one of the power supply interfaces, and the selected power supply controller automatically executing a tuning algorithm in response to the tune command.

BRIEF DESCRIPTION OF THE DRAWINGS

The invention may be better understood by referring to the following detailed description when taken in conjunction with the accompanying figures. In the drawings, each identical or nearly identical component that is illustrated in various figures is represented by a like numeral. For purposes of clarity, not every component may be labeled in every figure. In the drawings.

DETAILED DESCRIPTION

The present invention provides methods and apparatus for automated tuning of charged particle beam systems, including but not limited to ion implanters. Tuning is required when the parameters of the ion beam being generated by the ion implanter, such as ion species and/or ion energy, are changed. In addition, tuning may be required at intervals during operation to compensate for drift and other changes which may affect the ion beam. The present invention provides methods and apparatus for tuning with increased speed in comparison with prior art manual and automated tuning techniques. The invention is particularly useful for tuning of slow response components, such as magnetic components, but is not limited to slow response components. An ion implanter suitable for implementing the present invention is described below. However, the invention is applicable to any ion implanter and, more generally, to any charged particle beam system, such as a charged particle accelerator or a mass spectrometer.

Figure 1:
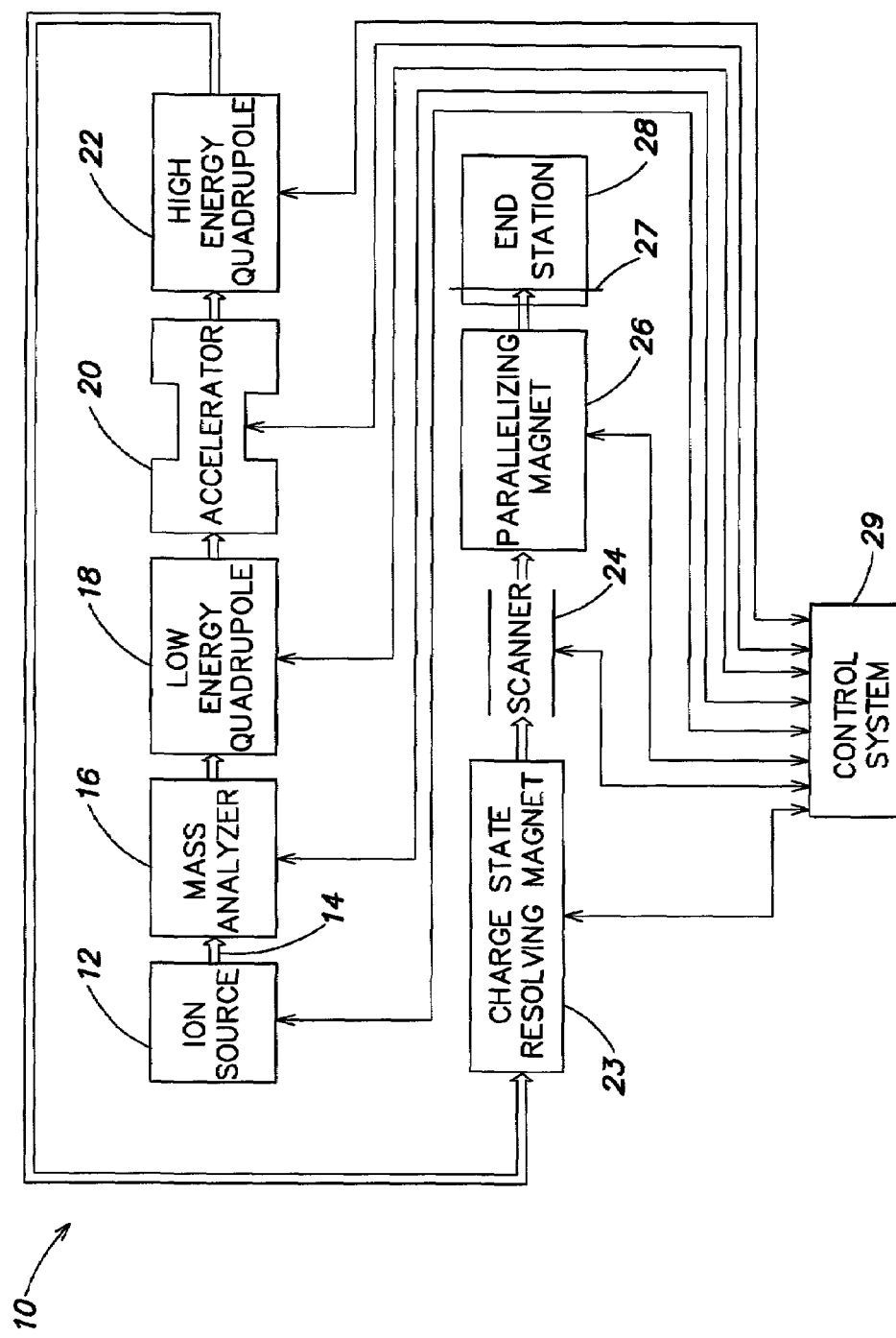
FIG. 1 is a block diagram of an embodiment of an ion implanter suitable for implementation of the present invention.

As shown in FIG. 1, an ion implanter 10 includes an ion source 12. Ions from the source 12 are accelerated by application of an extraction voltage to form a positive ion beam 14. The ion beam at this stage includes multiple elements and multiple isotopes of the ionized source material. A particular isotope is selected by a mass analyzer 16. The ion beam 14 is then conditioned in a low energy magnetic quadrupole 18, which focuses the beam and centers it prior to entering an accelerator 20. The ion beam 14 is accelerated to a desired energy by accelerator 20.

After the ion beam 14 leaves the accelerator 20, it is again conditioned by a high energy magnetic quadrupole 22 which focuses the beam 14 on the entrance to a scanner 24. The beam 14 passes from high energy quadrupole 22 to scanner 24 through a charge state resolving magnet 23 which removes ions having undesired charge states. The scanner 24 scans the beam across the surface of a wafer 27 in an end station 28. A parallelizing magnet 26 is provided to parallelize the beam prior to incidence of the beam 14 on the wafer 27 in end station 28, to ensure that the beam 14 is incident on the wafer 27 at a constant angle across its surface. Movable Faraday cups are provided along the beam path to facilitate tuning of the ion beam 14.

Control System

Figure 2:
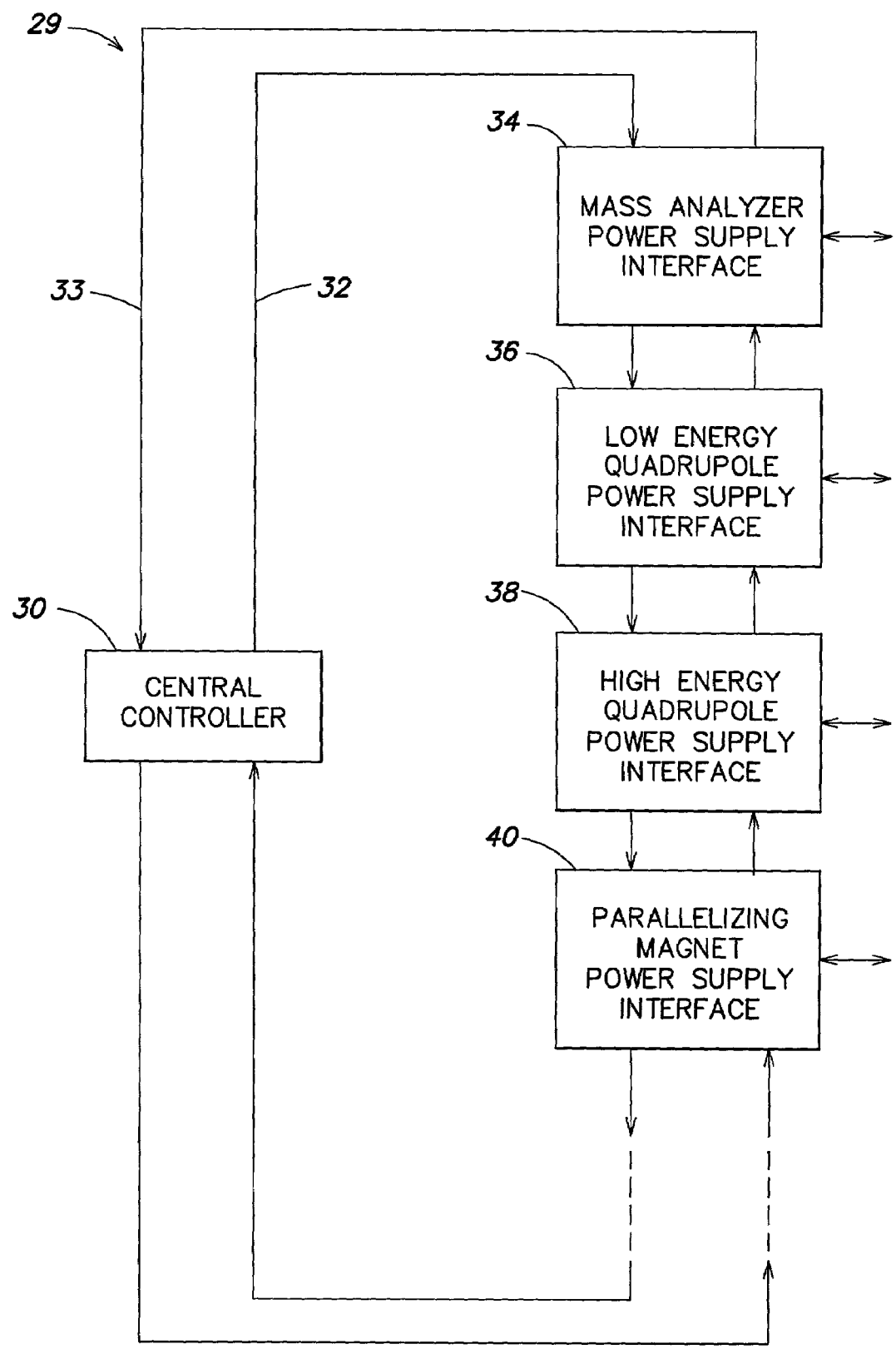
FIG. 2 is a block diagram of an embodiment of the control system in the ion implanter of FIG. 1.

A control system 29 is provided to control each of the components 12, 16, 18, 20, 22, 23, 24, 26 of the ion implanter. As shown in FIG. 2, the control system 29 may include a central controller 30 and one or more decentralized power supply interfaces. The central controller 30 may be used in conjunction with the decentralized power supply interfaces to set generalized parameters, such as operating voltages and currents, for these components and to tune the individual components to optimize the ion beam.

In one embodiment, the central controller 30 is a combination of hardware, firmware and software components of a computer system configured to receive input from the user of the ion implanter and to use that input to control and tune the ion implanter. The computer system, in this instance, may be configured to run autonomously to enable the ion implanter to generate a desired beam profile without significant intervention by the user, other than initially inputting the desired beam parameters. The invention is not limited to the disclosed embodiments, and may take many different forms depending on the particular requirements of the control system, the physical interrelationship of the components of the ion implanter, and the type of computer equipment employed. For example, the control system may optionally, but need not necessarily, perform additional functions such as tracking individual wafers, regulating dose levels applied to the wafers during implanting operations, and any other functions commonly performed by a control system associated with the ion implanter.

A block diagram of an example of a suitable control system is shown in FIG. 2. The ion implanter control system 29 includes the central controller 30 and power supply interfaces associated with individual components or groups of components of the ion implanter. Central controller 30 is coupled by a first serial link 32 and a second serial link 33 to a mass analyzer power supply interface 34, a low energy quadrupole power supply interface 36, a high energy quadrupole power supply interface 38 and a parallelizing magnet power supply interface 40. Each of the serial links 32 and 33 connects the power supply interfaces in a loop. The control system 29 may include additional power supply interfaces, as indicated by the dashed portions of serial links 32 and 33. Two serial links connected in opposite directions to the power supply interfaces are utilized for redundancy. The serial links 32 and 33 may utilize optical fiber communication and may utilize the SDLC serial protocol, as known in the art. The power supply interfaces 34-40 communicate with the respective components of the ion implanter and with central controller 30 as described below.

It will be understood that different control system architectures may be utilized. For example, the serial links 32 and 33 may utilize optical or electrical signaling. Furthermore, the serial links 32 and 33 may be replaced by parallel busses or any other suitable communication technique. The central controller 30 may be directly connected to each of the power supply interfaces rather than through a loop configuration.

The functionality of the control system may be partitioned in different ways. In a preferred embodiment, the power supply interfaces 34-40 have sufficient intelligence to perform tuning algorithms as described below. This architecture has the advantage of increased tuning speed where the central controller 30 communicates with the individual power supply interfaces relatively infrequently. In another architecture, most or all of the functionality of the power supply interfaces is incorporated into the central controller 30. This approach has the disadvantage of increased complexity in the central controller 30.

The central controller 30 may be a general purpose computer including a microprocessor, memory devices such as RAM, ROM and disk storage, a user interface and a communication port for communicating with power supply interfaces 34-40. The user interface may include a video monitor, a keyboard and a pointing device, as known in the art. The computer system may also be implemented in specially programmed, special purpose hardware, application-specific integrated circuits, or any other combination of hardware and software components.

Figure 3:
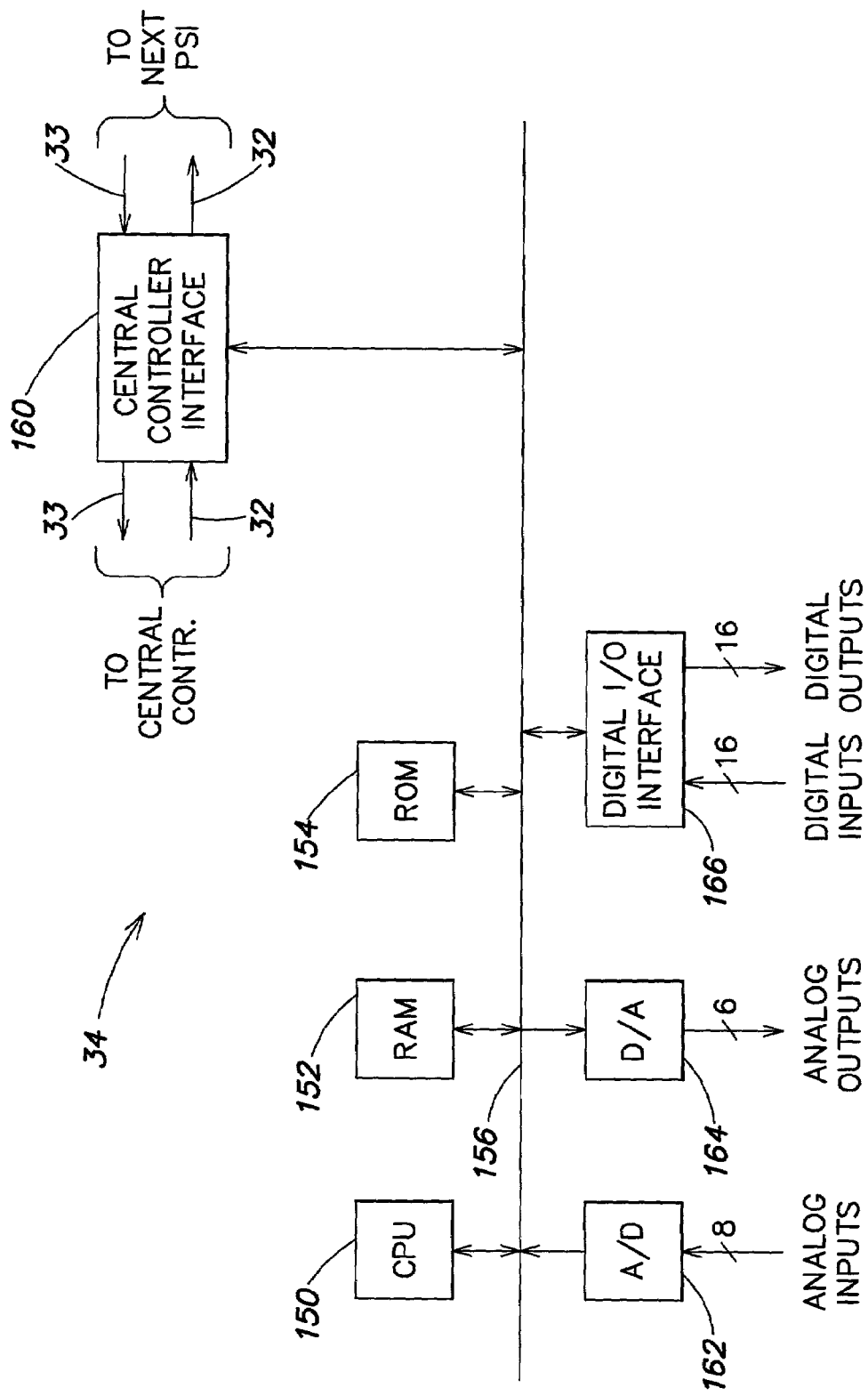
FIG. 3 is a block diagram of an embodiment of the power supply interfaces of FIG. 2.

A block diagram of an embodiment of mass analyzer power supply interface 34 is shown in FIG. 3. A general purpose hardware configuration may be utilized, and power supply interfaces 36-40 may have the same hardware configuration. Power supply interface 34 includes a processor (CPU) 150, a random access memory (RAM) 152 and a read only memory (ROM) 154 interconnected by a bus 156. A central controller interface 160 provides an interface between serial links 32, 33 and bus 156. An analog-to-digital converter 162 receives analog inputs from components of the ion implanter and provides corresponding digital signals to bus 156. A digital-to-analog converter 164 receives digital signals on bus 156 and provides analog outputs to components of the ion implanter. A digital I/O interface 166 coupled to bus 156 receives digital inputs from the ion implanter and supplies digital outputs to the ion implanter. The power supply interface is programmed for performing a variety of operating, setup and diagnostic functions and, in particular, for executing tuning algorithms as described below. It will be understood that the power supply interface is not limited to the embodiment of FIG. 3 and that a variety of general purpose and special purpose processor configurations may be utilized within the scope of the invention.

Control Process

Figure 4:
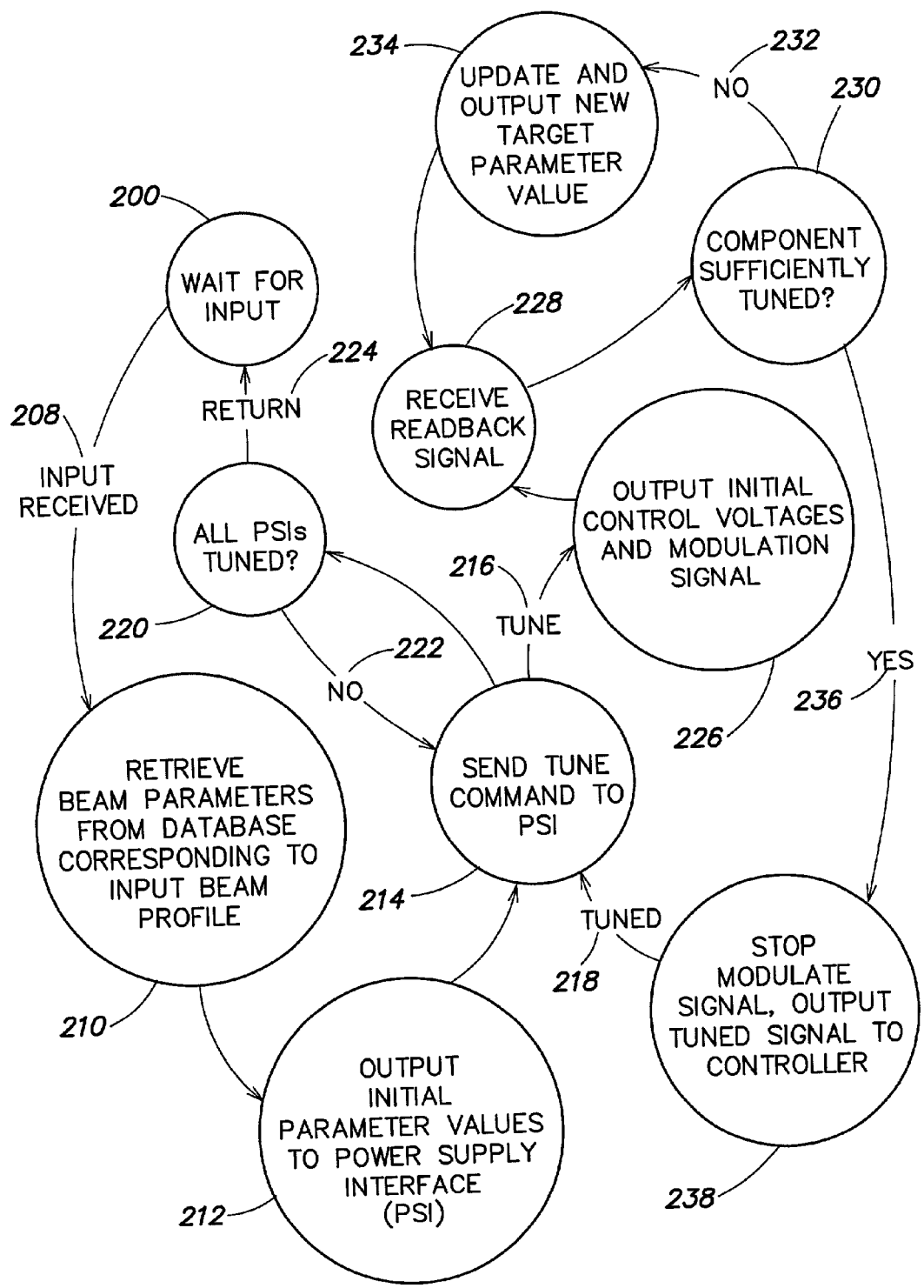
FIG. 4 is a state diagram of an embodiment of a control program that may be implemented in the central controller and the power supply interfaces of FIG. 2.

An example of a control process implemented by the ion implanter control system of FIG. 2 is illustrated in FIG. 4. In one embodiment, one subset of the process steps is implemented by central controller 30, and other subsets of the process steps are implemented by power supply interfaces 34-40. In the illustrated embodiment, this split of the control process between the central controller 30 and the power supply interfaces 34-40 advantageously frees the central controller 30 to undertake additional tasks. Additionally, this configuration enables the central controller 30 to delegate control over localized subgroups of components to the power supply interfaces to thereby minimize the number of communication channels required of the computer. Furthermore, by placing part of the control functionality in the power supply interfaces 34-40, ion implanter tuning speed can be increased in comparison with prior art ion implanter architectures wherein the computer received updates from the power supply interfaces at a rate on the order of 10 Hz to 20 Hz. In the embodiment illustrated in FIG. 4, steps 200-216 and 220-224 are executed by the central controller 30, and steps 218 and 226-238 are executed by one or more of the power supply interfaces 34-40. The invention is not limited in this regard, however, as any convenient split of the control process between central controller 30 and power supply interfaces 34-40 may be utilized. Indeed, the invention is not limited to a system that utilizes a split of the control process in this manner, as the central controller 30 may be configured to execute all steps of the control process, if desired. The processes undertaken to implement the procedures by each power supply interface are discussed in detail below.

In the embodiment shown in FIG. 4, the central controller 30 initially waits for input in step 200. When the central controller 30 receives input from the user in step 208 regarding a desired beam profile to be produced by the ion implanter 10, the central controller 30 retrieves information from a database corresponding to the desired beam profile in step 210. The central controller 30 then outputs initial parameter values to the power supply interfaces 34-40 in step 212 to establish a beam, and instructs the first power supply interface 34 to tune an associated component by sending a tune command to the power supply interface in steps 214 and 216. When the central controller 30 receives a response from one of the power supply interfaces 34-40 in step 218 indicating that the power supply interface has tuned its respective component of the ion implanter 10, the central controller 30 checks to determine if all the power supply interfaces have tuned their respective components in step 220. If not all components have been tuned in step 222, the central controller 30 sends a tune command to the next one of the power supply interfaces 34-40 in steps 214 and 216. When all components have been tuned, the central controller 30 returns in step 224 to wait for additional input in step 200. An ion implanter is typically tuned starting at the ion source and working downstream toward the wafer. However, the invention is not limited in this regard.

The operator of the ion implanter 10 optionally may be updated at one or more intervals during this process. Preferably, the operator of the ion implanter 10 is notified at least in step 224 when the ion implanter has been tuned.

Upon receipt of a tune command in step 216, the respective power supply interface outputs initial control voltages to one or more of the components of the ion implanter 10 over which it has control in step 226. To enable tuning of the components to take place, the power supply interface also outputs a modulation signal to a control component in step 226, as discussed in detail below. The modulation signal is used to modulate a control parameter, such as an operating voltage or current of a control component, for the purpose of monitoring the effect of a target component on the ion beam and thereby determining how to adjust a target parameter that affects the target component.

After setting the initial control voltages, the power supply interface modulates the control parameter and, during the modulation, receives a readback signal in step 228 that is representative of beam current or another beam parameter of interest. The power supply interface uses the readback signal to determine whether the target component is sufficiently tuned and whether alteration of the target parameter is likely to improve the tuning of the target component in step 230. The determination of whether the target component is sufficiently tuned is described below. Since the readback signal reflects the effect of the modulation signal on the ion beam, the power supply interface monitors operation of the ion implanter 10 over a range of values and infers therefrom the direction in which the target parameter should be adjusted to achieve tuning of the target component.

If the target component is not sufficiently tuned in step 232, the power supply interface outputs a new target parameter in step 234. The new target parameter may be calculated using any appropriate algorithm, such as by adding or subtracting a fixed or variable amount from the current target parameter. If the amount to be added or subtracted varies, the particular amount may be determined, for example, by the power supply interface using an interpolation algorithm, integration algorithm, or other algorithm likely to cause the target parameter to converge to the optimal value in an efficient manner, as discussed below.

Once the target parameter has been output in step 234, the power supply interface receives the readback signal in step 228 and again determines if the component is sufficiently tuned in step 230. The power supply interface iterates the tuning process of steps 228, 230, 232 and 234 until it determines that the target component is sufficiently tuned in step 236, as discussed below. Once the power supply interface has completed the tuning procedure, it terminates the modulation signal in step 238 and outputs a tuned response to the central controller 30 in step 218. A power supply interface may be responsible for tuning one or more components, or one or more parameters of a given component, in which case the power supply interface executes the tuning process of steps 228, 230, 232 and 234 for each component or parameter to be tuned.

Tuning Process

One goal of the tuning process is to achieve maximum ion beam current of the desired ion species through the ion implanter beamline. For magnetic components, such as mass analyzer 16 and parallelizing magnet 26, the prior art tuning process typically involved varying the magnet current over a range of values and monitoring the beam current. The magnet current was set at the value which produced maximum beam current. However, the magnetic components used in ion implanters and other charged particle beam systems are typically large and have inherently slow responses to changes in magnet current. Accordingly, the tuning process was inherently slow.

Figure 5:
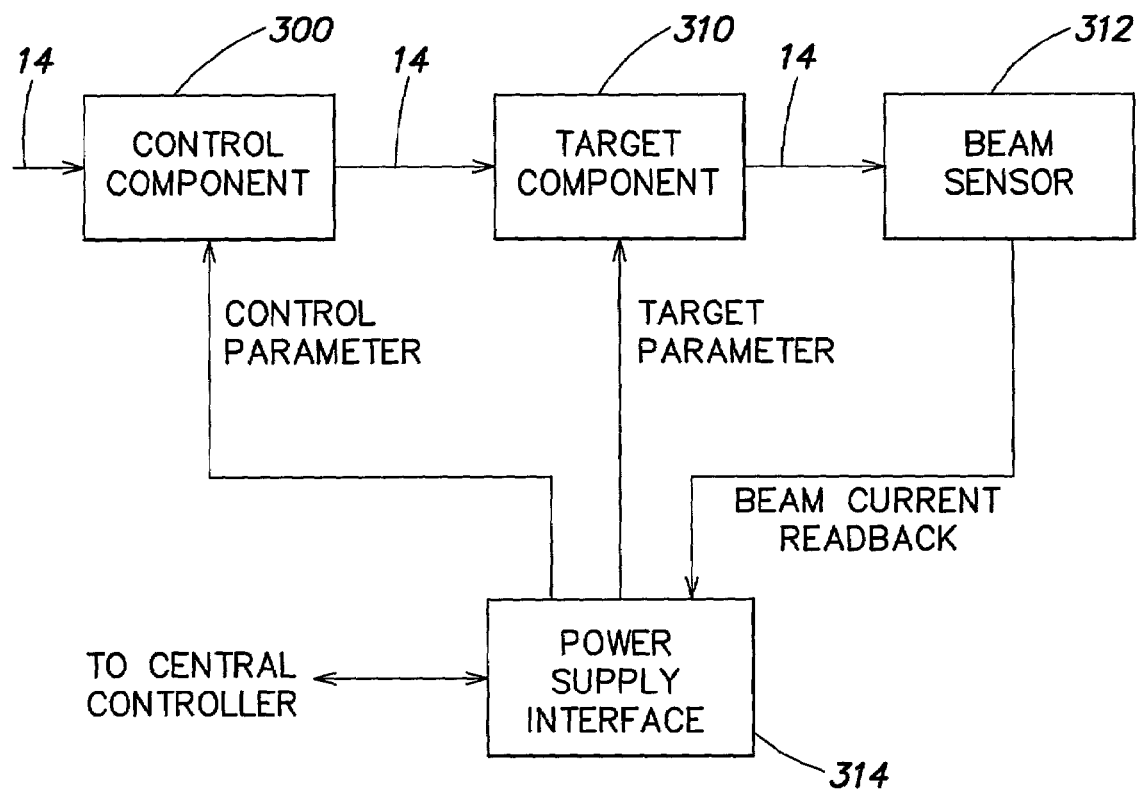
FIG. 5 is a block diagram of the beamline components associated with a tuning procedure in accordance with a feature of the invention.

Referring to FIG. 5, the speed of the tuning process is increased, according to an aspect of the invention, relative to prior art tuning processes by modulating a control parameter of a control component 300 and observing the effect on the ion beam downstream of the target component. The modulation, in effect, produces a sweep of the control parameter, either continuously or in steps, over a range of values. The modulation may be a periodic waveform or a series of discrete values, for example. The target component 310 typically has a variable effect on the ion beam as the control parameter is varied, or modulated, because of a special relationship between control component 300 and target component 310.

In FIG. 5, target component 310 is the component that requires tuning and control component 300 is a component that is used to assist in the tuning of target component 310. The ion beam current may be observed, for example, by a beam sensor 312, such as a Faraday beam sensor, located downstream of target component 310. The control parameter and the target parameter are generated by a power supply interface 314, and a beam current readback from beam sensor 312 is monitored by power supply interface 314.

The effect of the modulated control parameter on the ion beam downstream of target component 310 is used to evaluate the need for adjustment of a target parameter of the target component 310. In cases where the evaluation of the tuning of the target component 310 indicates a mistuned condition, the target parameter may be adjusted to improve tuning. Typically, the target component 310 is a slow response component, such as a magnetic component, and the control component 300 is a fast response component, such as an electrostatic beam accelerator or an electrostatic beam deflector. The tuning procedure relies upon the known relationship between control component 300 and target component 310 and upon the fact that the ion beam current downstream of target component 310 is a function of both the target parameter and the control parameter.

As noted above, the ion beam current may be monitored by a Faraday beam sensor. In other embodiments, the ion beam current may be monitored by a sensing coil, such as a Pearson coil. In one specific embodiment, the ion beam current may be monitored by a modular parametric current transformer available from Bergoz. In general, any device capable of sensing ion beam current may be utilized.

Power supply interface 314, in accordance with a tuning algorithm, modulates the control parameter and evaluates the tuning of the target parameter in response to the beam current readback. If a mistuned condition is observed, the target parameter may be adjusted. The power supply interface 314 receives tuning commands from a central controller and may execute the tuning algorithm autonomously in response to the tuning command.

In the embodiment of FIG. 5, a tuning method referred to herein as the "image" method employs target component 310 and control component 300 located upstream of target component 310. In another embodiment, a tuning method referred to herein as the "search" method does not employ a separate control component, and evaluation of tuning is performed by modulating the target parameter and monitoring the effect of such modulation on the ion beam current downstream of the target component. In a further embodiment, the spot size of the ion beam is evaluated by scanning the beam across the edge of an aperture and evaluating the sharpness of the beam focus.

For any beamline component, such as target component 310, there is a function F1 relating a target parameter for that component to the beam current. This function may be expressed as a graph, with the target parameter on the X axis and the beam current on the Y axis. When correct tuning corresponds to maximum beam current, which is true for most beamline components, a goal of the tuning procedure is to locate a global peak on this graph and to adjust the target parameter to achieve maximum beam current.

In many cases, a second component, such as control component 300, has a special relationship to target component 310. Specifically, when the system is in a given state, it may be possible to cause the same change to the beam by adjusting the target parameter of target component 310 to a value A or by adjusting the control parameter of control component 300 to a value B. This is useful if it is easier to adjust the control parameter of control component 300 than to adjust the target parameter of target component 310, since similar tuning information may be obtained by adjusting either parameter. Mathematically, this is expressed as a transfer function T relating the target parameter of target component 310 and the control parameter of control component 300, such that adjusting the control parameter of control component 300 to the value B will result in the same beam current as adjusting the target parameter of target component 310 to value A. In effect, the range of possible settings for target component 310 maps to a range of possible settings for control component 300. This means that information regarding the correct setting of the target parameter of target component 310 may be obtained by varying the control parameter of control component 300.

Advantageously, it is not necessary to know the precise shape of the transfer function T if the transfer function T is a monotonic function. Specifically, the relationship may be exploited as long as the directional relationship between target component 310 and control component 300 is known. Thus, determining whether adjusting the control parameter of control component 300 above or below its baseline value produces the optimal beam current provides information regarding the direction in which the target parameter for target component 310 must be adjusted (assuming that the control parameter of control component 300 is returned to its baseline value).

By way of example, the deflection of a charged particle beam by a deflection magnet is a function of the magnetic field produced by the magnet and the energy of the charged particles in the charged particle beam. The mass analyzer 16 used for selecting a desired species from the ion beam is shown schematically in FIG. 6. Mass analyzer 16 includes a magnet 332, a resolving mask 334 and a magnet power supply 336. Magnet 332 includes spaced-apart magnet polepieces, having a gap between them for passage of ion beam 14, and a magnet coil (not shown). The magnet power supply 336 provides a magnet current to the magnet coil for producing a magnetic field B in the gap between the magnet polepieces. Resolving mask 334 includes a resolving slit 338 for passing the desired ion species.

The ion source 12 includes an arc chamber 340, an extraction electrode 342 and an extraction power supply 346. Arc chamber 340 generates ion beam 14, and extraction electrode 342 accelerates ion beam 14 to a desired energy. The energy of ion beam 14 is determined by an extraction voltage applied to extraction electrode 342 by extraction power supply 346.

When mass analyzer 16 is properly tuned, the desired ion species in ion beam 14 is deflected by a known angle by magnet 332 and passes through resolving slit 338. Undesired ion species are deflected by different angles and are intercepted by resolving mask 334. The deflection of the desired ion species by magnet 332 is a function of the magnetic field B in the gap between the magnet polepieces, which in turn is an approximate function of the magnet current supplied by magnet power supply 336. In addition, the deflection of ion beam 14 by magnet 332 is a function of the ion beam energy, which in turn is a function of the extraction voltage applied to the extraction electrode 342 of ion source 12.

In this example, the magnetic field B exhibits a slow response to changes in magnet current, whereas the beam energy exhibits a fast response to changes in extraction voltage. In order to rapidly tune the slow response magnet 332, the magnet is designated as the target component and the extraction electrode 342 of ion source 12 is designated as the control component. The extraction voltage (the control parameter) is modulated about a desired baseline value, and the beam current downstream of resolving slit 338 is monitored, typically by a Faraday beam sensor 350. Faraday beam sensor 350 preferably includes a current-to-voltage converter which provides a Faraday readback voltage in response to the sensed beam current. The readback voltage thus represents ion beam current.

The power supply interface obtains a set of paired values of the control parameter and the corresponding beam current. The control parameter values may be predetermined modulation values or measured values. The paired values are obtained simultaneously or nearly simultaneously. The sets of paired values are used to evaluate the tuning of the target component.

Figure 7:
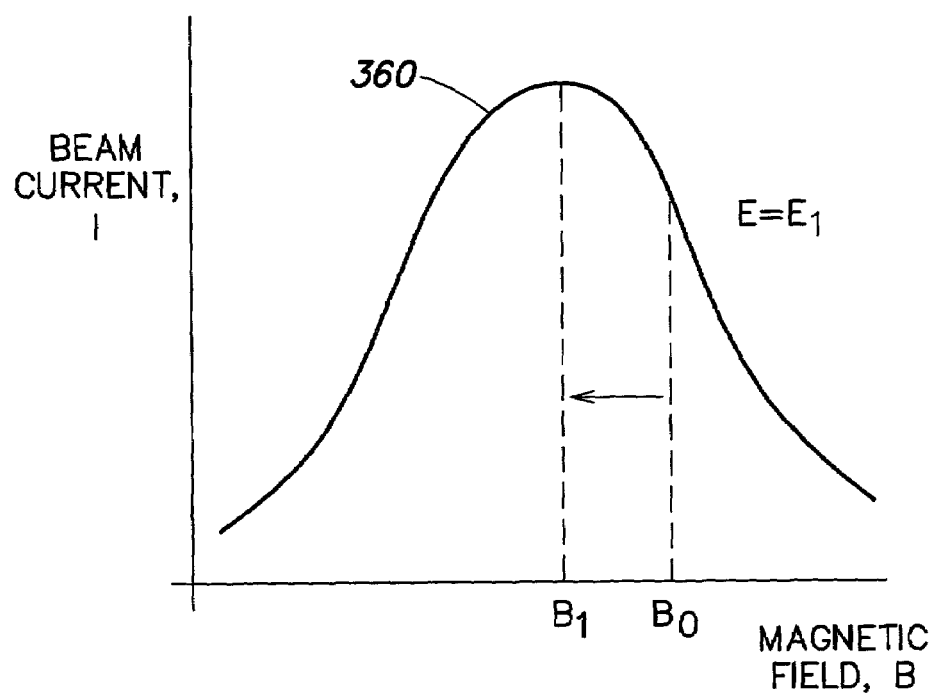
FIG. 7 is a graph of beam current downstream of the resolving slit as a function of magnetic field B in the configuration of FIG. 6.
Figure 8:
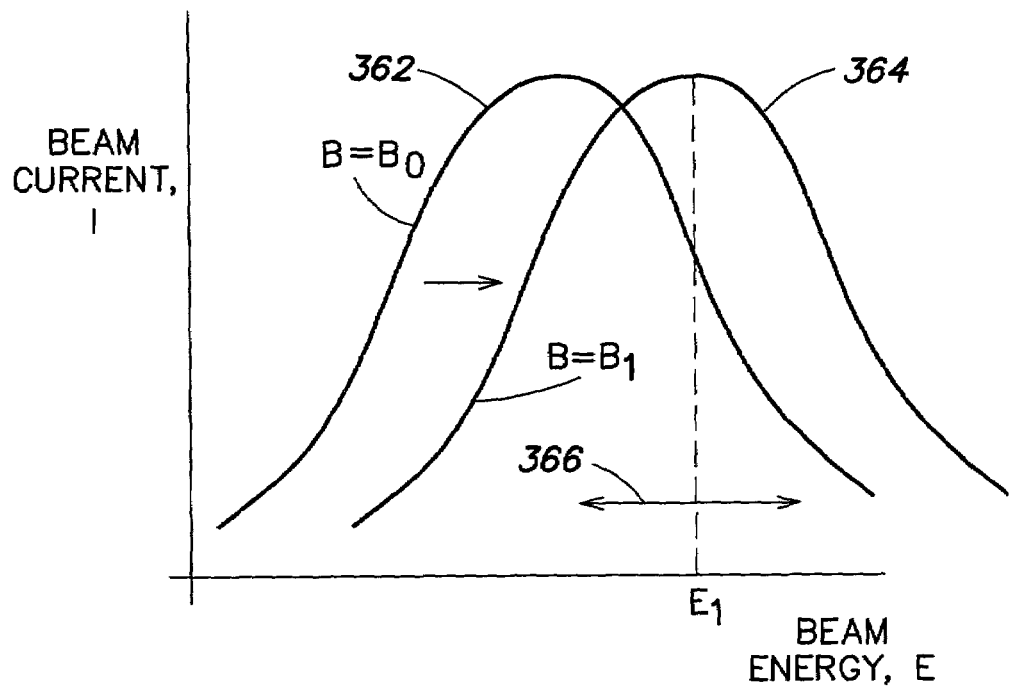
FIG. 8 is a graph of beam current downstream of the resolving slit as a function of beam energy E in the configuration of FIG. 6.

As shown in FIG. 7, a curve 360 represents the beam current I downstream of resolving slit 338 as a function of the magnetic field B produced by magnet 332. The beam current has a peak value for a magnetic field $B_1$. Assume that the magnetic field has an initial value of $B_0$ and that the required beam energy is $E_1$, as established by the requirements of the implant process. The goal of the tuning process is to adjust the magnetic field to a value $B_1$ such that the peak beam current I downstream of resolving slit 338 occurs at required energy $E_1$. As shown in FIG. 8, the beam current downstream of resolving slit 338 is also a function of beam energy E. A curve 362 represents beam current as a function of beam energy for a mistuned condition where the magnetic field is $B_0$ and the peak beam current does not occur at energy $E_1$. Curve 364 represents beam current as a function of beam energy for a tuned condition where the magnetic field is $B_1$, and the peak beam current occurs at energy $E_1$.

Figure 6:
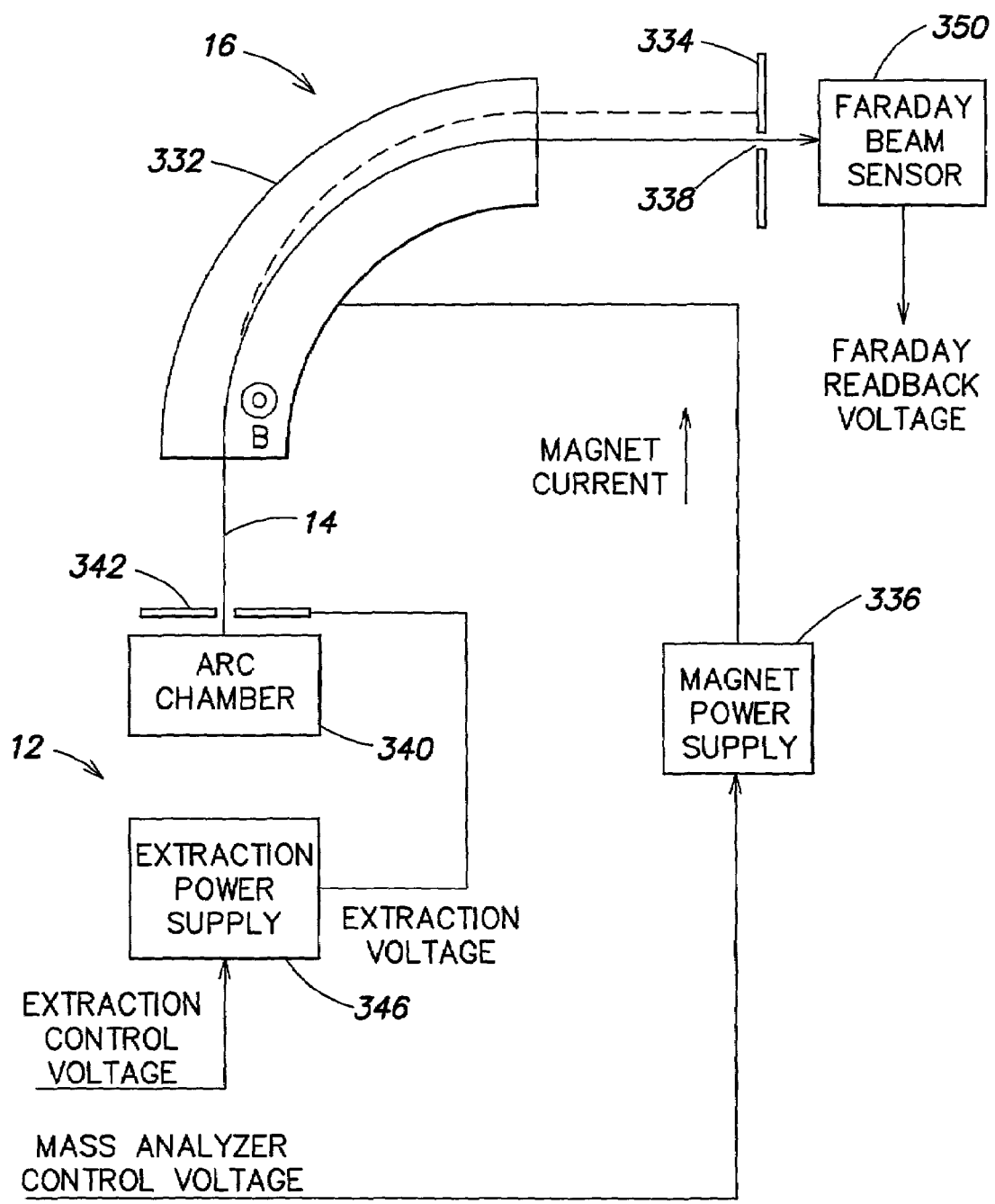
FIG. 6 is a schematic block diagram of an example of the target and control components shown in FIG. 5.
Figure 9:
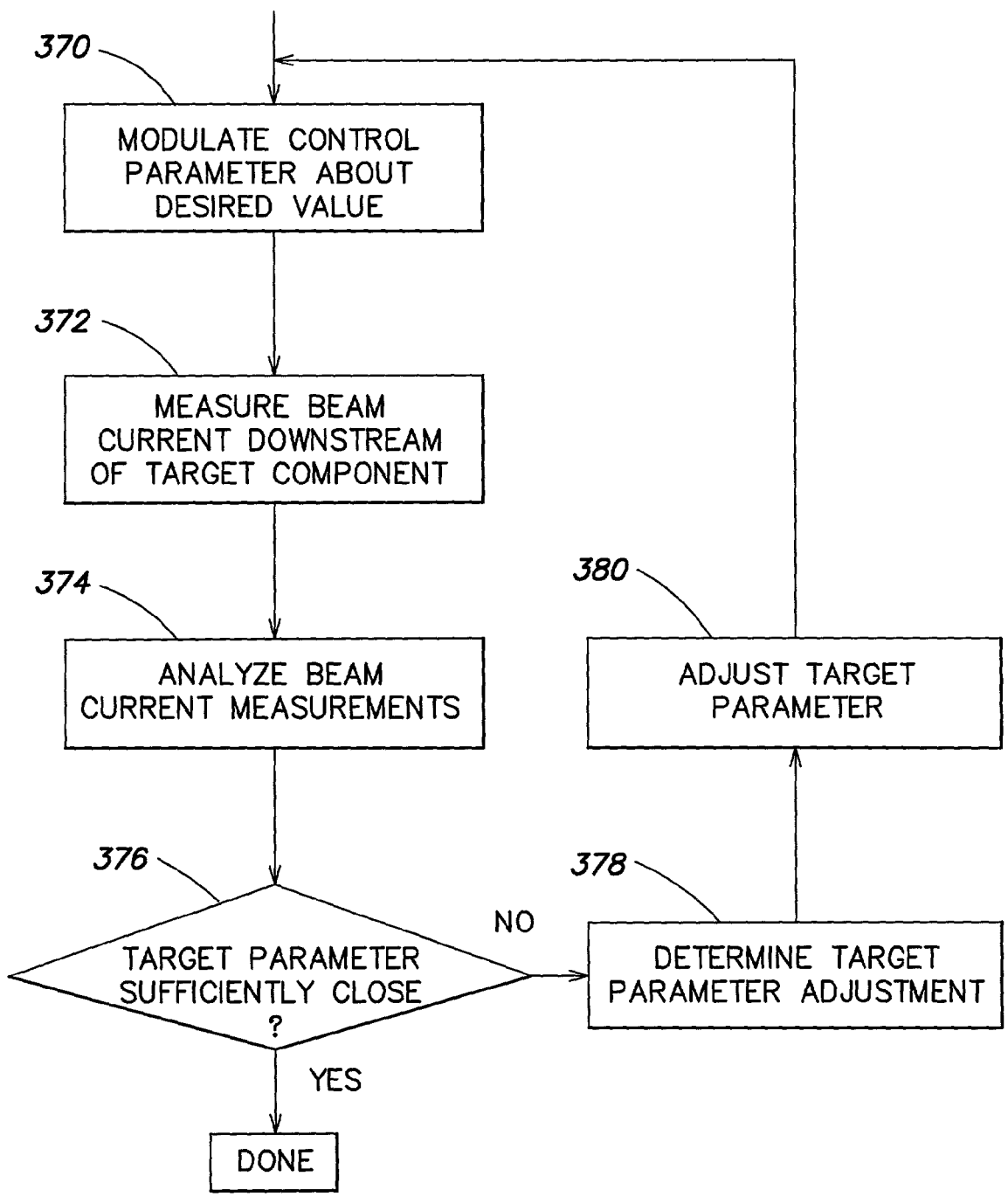
FIG. 9 is a flow chart of an example of a tuning procedure for tuning a target component in accordance with a feature of the invention.

An example of a process for rapidly tuning mass analyzer magnet 332 to ensure operation at the magnetic field $B_1$ which produces peak beam current at energy $E_1$ is described with reference to the flow chart of FIG. 9. The slow response magnet 332 is designated as the target component and the fast response extraction electrode 342 of ion source 12 is designated as the control component. In step 370, the control parameter (extraction voltage) is modulated about the desired value by modulating the extraction control voltage supplied to extraction power supply 346. In the example of FIGS. 6-8, the extraction voltage is modulated so as to modulate the beam energy about required beam energy $E_1$, as indicated by arrow 366 in FIG. 8.

Figure 10:
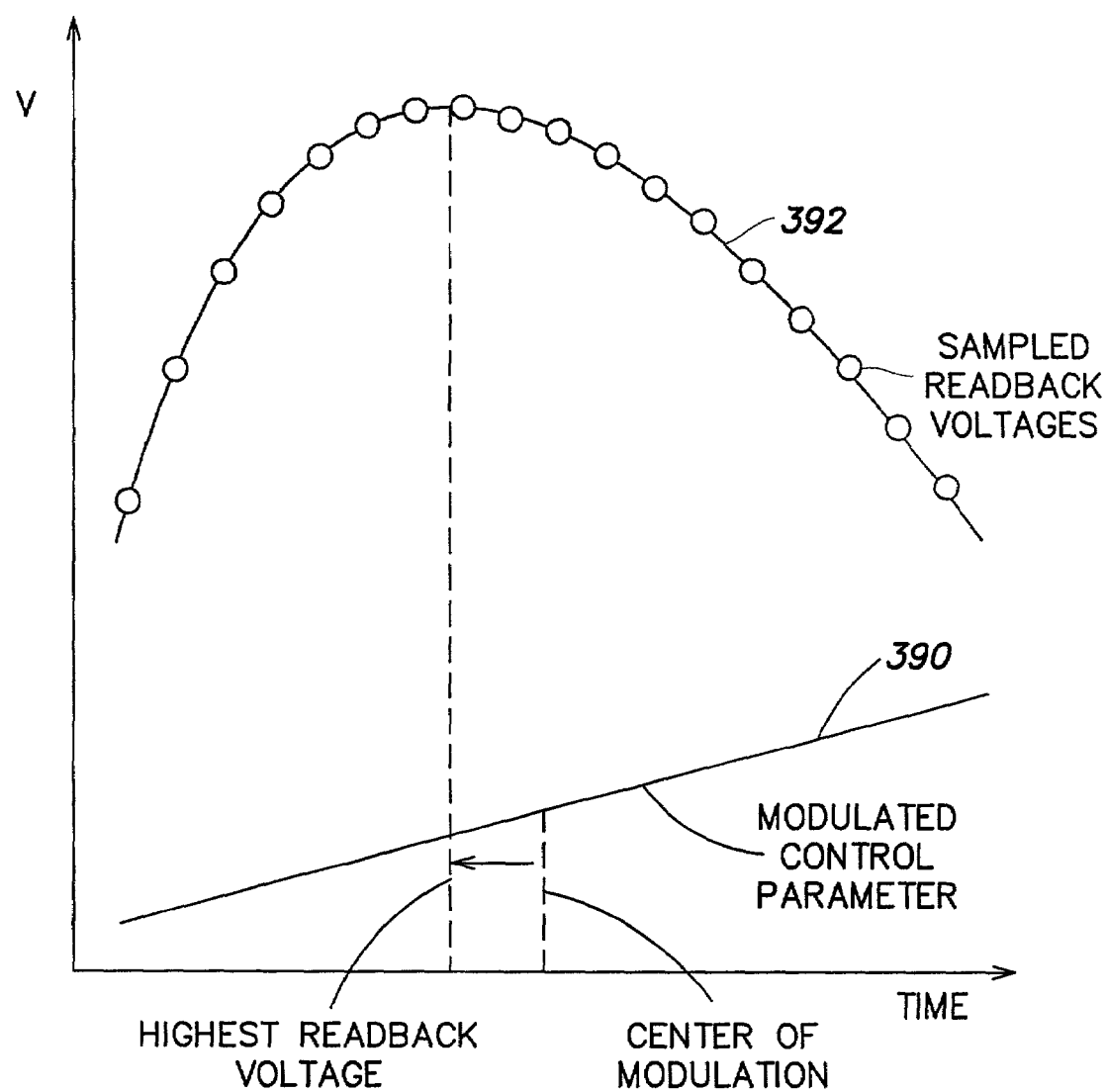
FIG. 10 is a graph of voltage as a function of time, showing an example of measured readback voltage as the control parameter is modulated.

In step 372, the beam current downstream of the target component is measured as the control parameter is modulated. In the example of FIGS. 6-8, the beam current downstream of resolving slit 338 is measured by Faraday beam sensor 350. Thus the beam current at a desired deflection angle is measured. FIG. 10 is a graph of voltage as a function of time and illustrates an example of Faraday readback voltage as a function of time during modulation of the control parameter. In FIG. 10, curve 390 represents the modulated control parameter and curve 392 represents the sampled Faraday readback voltage. The center of modulation of the control parameter occurs at time $t_1$, and the peak readback voltage occurs at time $t_2$, indicating a mistuned condition. The beam current measurements are analyzed in step 374, and, in particular, the peak beam current may be compared with the beam current at the desired beam energy $E_1$. The difference between the peak beam current and the beam current at energy $E_1$ is indicative of the tuning or mistuning of the target component. That is, where the peak beam current and the beam current at energy $E_1$ differ, the target component is mistuned.

In step 376, a determination is made as to whether the target parameter is sufficiently close to a desired value representative of optimal tuning. The determination of whether the target parameter is sufficiently close to the desired value is discussed below. However, the determination can be based on a decision that the beam current at energy $E_1$ is within a specified range of the peak beam current.

When the target parameter is determined in step 376 not to be sufficiently close to the desired value, a target parameter adjustment is determined in step 378. Both an adjustment direction and an increment size are associated with the target parameter adjustment. The adjustment direction is typically known based on a direction of displacement of curve 362 (FIG. 8) from energy $E_1$ and the operating characteristics of the control and target components. The adjustment direction may be preprogrammed into the controller in response to the beam current measurements obtained in step 372. The magnitude of the target parameter adjustment can also be based on knowledge of the control component and the target component and the difference between the peak beam current and the beam current at energy $E_1$. However, a precise adjustment magnitude is not required, since adjustment can be completed in one or more iterations of the tuning process. In one approach, the adjustment increments are larger at the start of the tuning process and decrease on subsequent iterations. In step 380, the target parameter is adjusted in the selected direction by the selected adjustment increment. The process then returns to step 370 to perform another iteration of the tuning process. If a determination is made in step 376 that the target parameter is sufficiently close to the desired value, the tuning process for the target component is complete.

Power Supply Interfaces

Individual power supply interfaces 34-40 and components affected by the respective power supply interfaces 34-40 are illustrated in FIGS. 11, 13, 15 and 17. Control of the components of the ion implanter 10 is discussed in connection with power supply interfaces 34-40, which implement the tuning algorithms described herein. Flow diagrams of embodiments of the tuning processes performed by power supply interfaces 34-40 are shown in FIGS. 12, 14, 16, and 18, respectively.

In FIGS. 11, 13, 15, and 17, the power supplies required for operation of the respective components of the ion implanter are included within the respective blocks, and the power supply interfaces provide control signals to the respective power supplies. Thus for example in FIG. 11, ion source 12 includes extraction power supply 346 (FIG. 6) and mass analyzer 16 includes magnet power supply 336.

Figure 11:
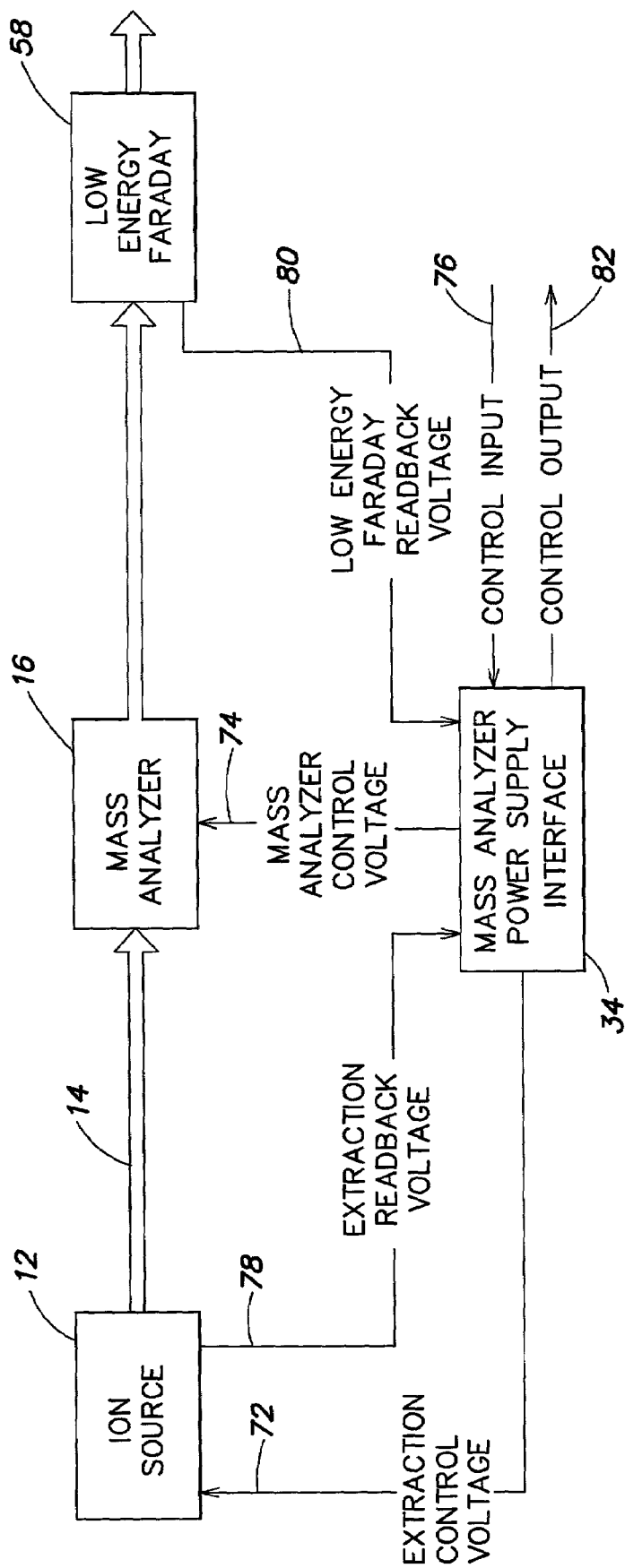
FIG. 11 is a block diagram of an embodiment of a first power supply interface and a first subset of components in the ion implanter of FIG. 1.

As shown in FIG. 11, the mass analyzer power supply interface (PSI) 34 interfaces with the ion source 12 the mass analyzer 16 and a low energy Faraday beam sensor 58. As known in the art, the Faraday beam sensor is a device which produces an electrical current in response to an ion beam. The Faraday beam sensor 58 preferably includes a current-to-voltage converter for generating a Faraday readback voltage in response to the sensed beam current. The PSI 34 outputs an extraction control voltage on line 72 to control the extraction power supply in ion source 12, and a mass analyzer control voltage on line 74 to control the mass analyzer power supply in mass analyzer 16. The PSI 34 communicates with the computer 32 via a control output signal on line 82. The PSI 34 also receives, as inputs, a control input signal on line 76 from computer 32, an extraction readback voltage on line 78 and a low energy Faraday readback voltage on line 80. The extraction readback voltage represents the output of the extraction power supply, and the Faraday readback voltage represents the beam current downstream of mass analyzer 16.

Figure 12:
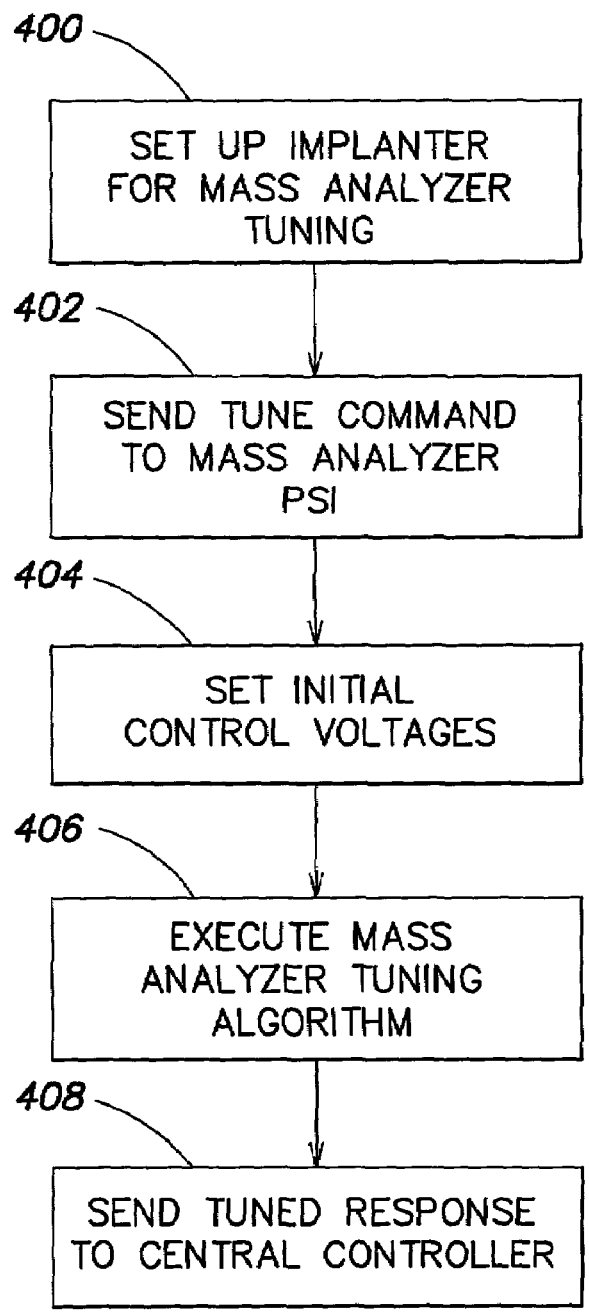
FIG. 12 is a flow chart of an embodiment of a program for execution by the power supply interface of FIG. 11.

In operation, as shown in FIG. 12, the central controller 30 sets up the ion implanter for mass analyzer tuning in step 400. This includes moving low energy Faraday beam sensor 58 into position. In step 402, the central controller 30 sends a tune command to the mass analyzer PSI 34. Approximate values of the control voltages for the selected beam profile are accessed in a system database by central controller 30 and are sent to the mass analyzer PSI 34. The mass analyzer PSI 34 uses the approximate values to set the initial control voltages in step 404. In particular, the mass analyzer PSI 34 sets the initial extraction control voltage on line 72 and the initial mass analyzer control voltage on line 74. The mass analyzer 34 then executes a mass analyzer tuning algorithm in step 406. The tuning algorithm shown in FIGS. 5-10 and described above is utilized. The mass analyzer PSI 34 modulates the extraction control voltage supplied to ion source 12 and monitors the low energy Faraday readback voltage. The readback voltage values are analyzed to determine required adjustments to the mass analyzer control voltage as described in detail above. Several iterations of the tuning algorithm may be required to achieve the desired tuning. After tuning of the mass analyzer has been completed, a tuned response is sent to the central controller 30 in step 408.

Tuning the mass analyzer 16 by modulating the mass analyzer control voltage on line 74 would be time consuming, since the magnet in the mass analyzer 16 may take several seconds to over a minute to stabilize when the control voltage on line 74 is changed.

To achieve faster tuning, the mass analyzer 16 is tuned by modulating the extraction control voltage on line 72 and monitoring the ion beam downstream of the mass analyzer 16 at the low energy Faraday beam sensor 58. Modulating the extraction control voltage on line 72 so as to vary the ion beam energy is equivalent to modulating the magnetic field of the magnet in mass analyzer 16 and enables the PSI 34 to determine the effect of stronger or weaker magnetic fields on the ion beam 14.

Figure 13:
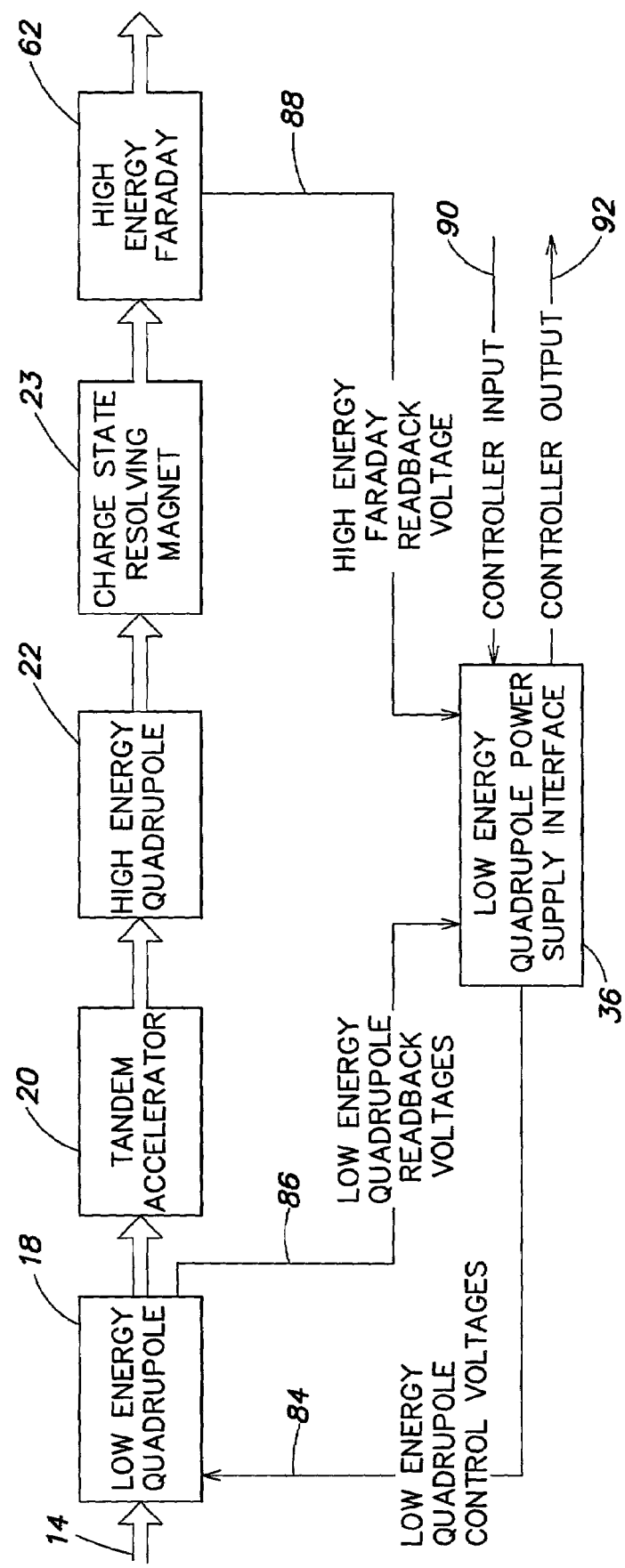
FIG. 13 is a block diagram of an embodiment of a second power supply interface and a second subset of components in the ion implanter of FIG. 1.

Tuning of the low energy magnetic quadrupole 18 is now described in connection with FIGS. 13 and 14. As shown in FIG. 13, the low energy magnetic quadrupole power supply interface (PSI) 36 interfaces with the low energy magnetic quadrupole 18 and a high energy Faraday 62. Specifically, the PSI 36 outputs low energy magnetic quadrupole control voltages on lines 84. The low energy magnetic quadrupole 18 in this embodiment has several pairs of electrodes, each pair of which receives its own operating voltage from a power supply. Accordingly, the control voltages on lines 84 are used to control multiple parameters of the low energy magnetic quadrupole 18, including left/right balance, up/down balance, strength and trim.

The PSI 36 also receives as inputs low energy magnetic quadrupole readback voltages on line 86, a high energy Faraday readback voltage on line 88, and a controller input on line 90. The low energy quadrupole readback voltages represent the outputs of the low energy quadrupole power supplies, and the high energy Faraday readback voltage represents the beam current downstream of charge state resolving magnet 23. When the low energy magnetic quadrupole 18 is fully tuned, the PSI 36 outputs a tuned response on line 92.

Figure 14:
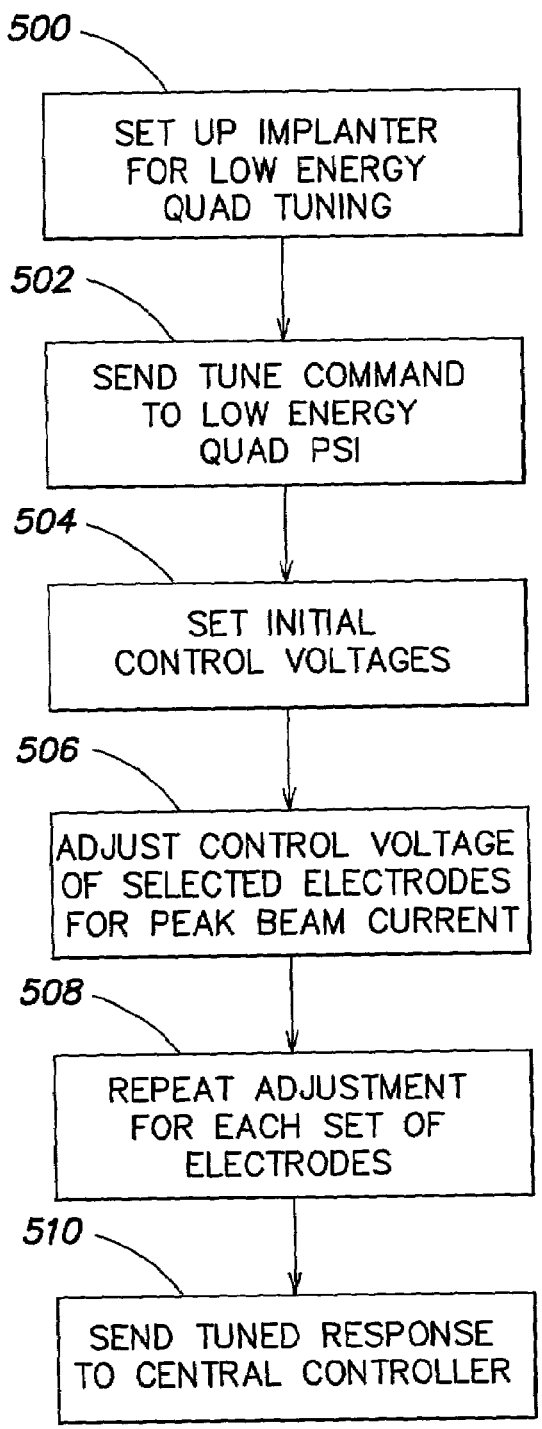
FIG. 14 is a flow chart of an embodiment of a program for execution by the power supply interface of FIG. 13.

In operation, as shown in FIG. 14, the central controller sets up the ion implanter for low energy quadrupole tuning in step 500. The setup includes moving the high energy Faraday beam sensor 62 into position. In one embodiment, high energy Faraday beam sensor 62 is located between the deflection plates of scanner 24. In another embodiment, high energy Faraday beam sensor 62 is located at a beam dump for parallelizing magnet 26. In this embodiment the parallelizing magnet 26 is turned off in order to make beam current measurements with high energy Faraday beam sensor 62. In step 502, the central controller 30 sends a tune command to low energy quadrupole PSI 36. Approximate values of the control voltages for the selected beam profile are accessed in the system database by central controller 30 and are sent to PSI 36. In step 504, PSI 36 uses the approximate values to set initial control voltages for the selected beam profile. In particular, PSI 36 sets low energy quadrupole control voltages for each of the sets of electrodes of low energy quadrupole 18 on lines 84. PSI 36 then adjusts a control voltage of a selected set of electrodes for peak beam current in step 506. This adjustment may be accomplished by modulating the control voltage of the selected electrodes and observing the control voltage value which provides peak beam current. The control voltage is then set at the value which provides peak beam current. In step 508, the adjustment process is repeated for each set of electrodes of low energy quadrupole 18. After all sets of electrodes have been adjusted for peak beam current, a tuned response is sent to central controller 30 in step 510.

The high energy Faraday beam sensor 62 then may be moved out of the path of the ion beam, if desired, or left in position for use by the other power supply interfaces which tune subsequent beamline elements, such as the charge state resolving magnet 23 or the high energy magnetic quadrupole 22.

To tune the low energy magnetic quadrupole 18, the PSI 36 superimposes an AC component on the DC control voltage of a selected line 84 to form a modulated control voltage. The actual voltages appearing on the electrodes of the low energy magnetic quadrupole 18 are input to the PSI 36 via low energy magnetic quadrupole readback voltages on lines 86. The PSI 36 receives high energy Faraday readback voltage samples on line 88, correlates those voltage samples to the voltages at the electrodes of the low energy magnetic quadrupole 18 and determines the control voltage that provides maximum beam current. The same process is then implemented for each set of electrodes of the low energy magnetic quadrupole 18.

Tuning of the high energy magnetic quadrupole 22 is similar to the process for tuning the low energy magnetic quadrupole. Likewise, tuning the charge state resolving magnet 23 is similar in concept to the process for tuning the mass analyzer 14 as discussed above in connection with FIGS. 11 and 12. Tuning of these two components is now described in connection with FIGS. 15 and 16.

Figure 15:
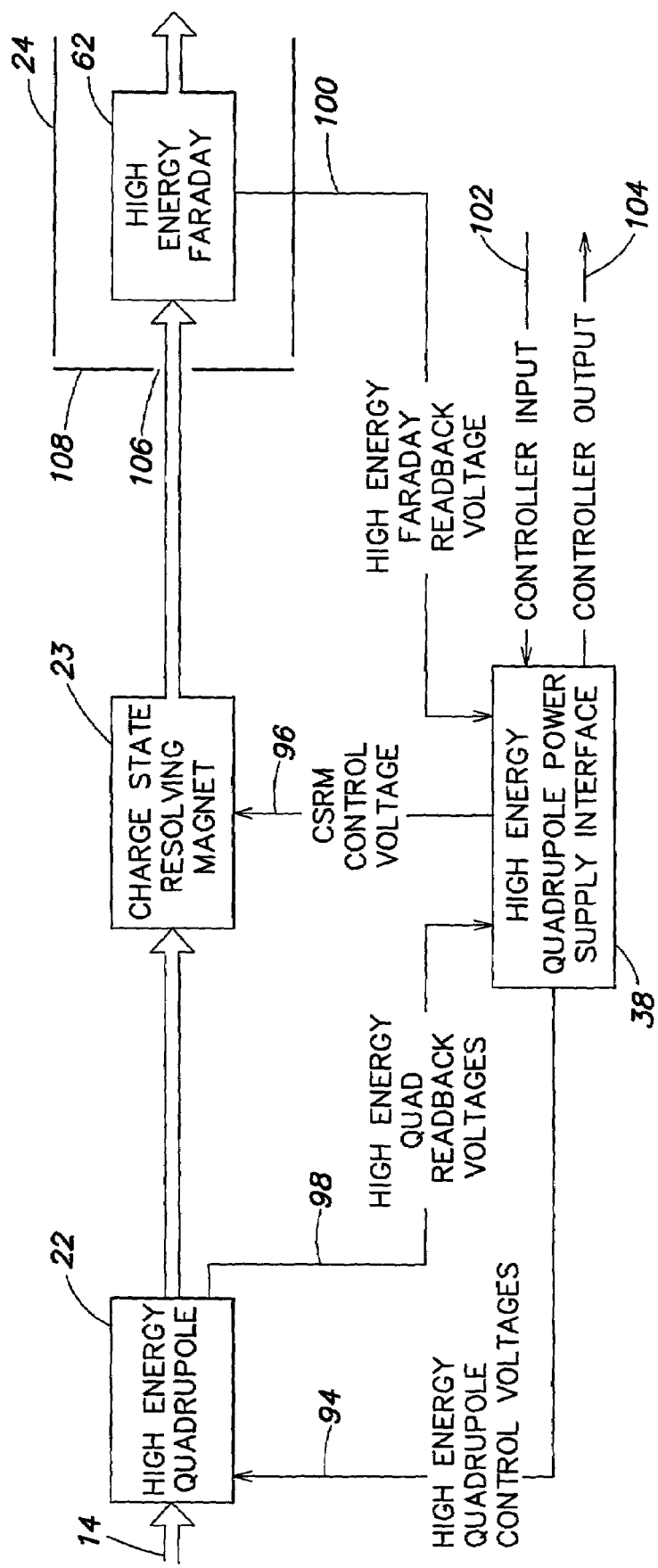
FIG. 15 is a block diagram of an embodiment of a third power supply interface and a third subset of components in the ion implanter of FIG. 1.

As shown in FIG. 15, the high energy magnetic quadrupole power supply interface (PSI) 38 interfaces with the high energy magnetic quadrupole 22, the charge state resolving magnet 23, and the high energy Faraday beam sensor 62. As noted above, high energy Faraday beam sensor 62 may be located in scanner 24 or may be located downstream of parallelizing magnet 26. The PSI 38 outputs high energy magnetic quadrupole control voltages on lines 94 and a charge state resolving magnet control voltage on line 96. The high energy magnetic quadrupole in this embodiment, like the low energy magnetic quadrupole 18, has several pairs of electrodes, each pair of which receives its own operating voltage from a power supply. The electrodes of the high energy magnetic quadrupole 22 in this instance each control one of several beam parameters, for example left/right balance and up/down balance. The high energy magnetic quadrupole 22 may control additional beam parameters, such as strength and trim, if desired.

The PSI 38 receives as inputs high energy magnetic quadrupole readback voltages on lines 98, a high energy Faraday readback voltage on line 100, and a control input on line 102. The high energy quadrupole readback voltages represent the outputs of the high energy quadrupole power supplies, and the high energy Faraday readback voltage represents the beam current downstream of charge state resolving magnet 23. After high energy magnetic quadrupole 22 and charge state resolving magnet 23 have been tuned, the PSI 38 outputs a tuned response on line 104.

Figure 16:
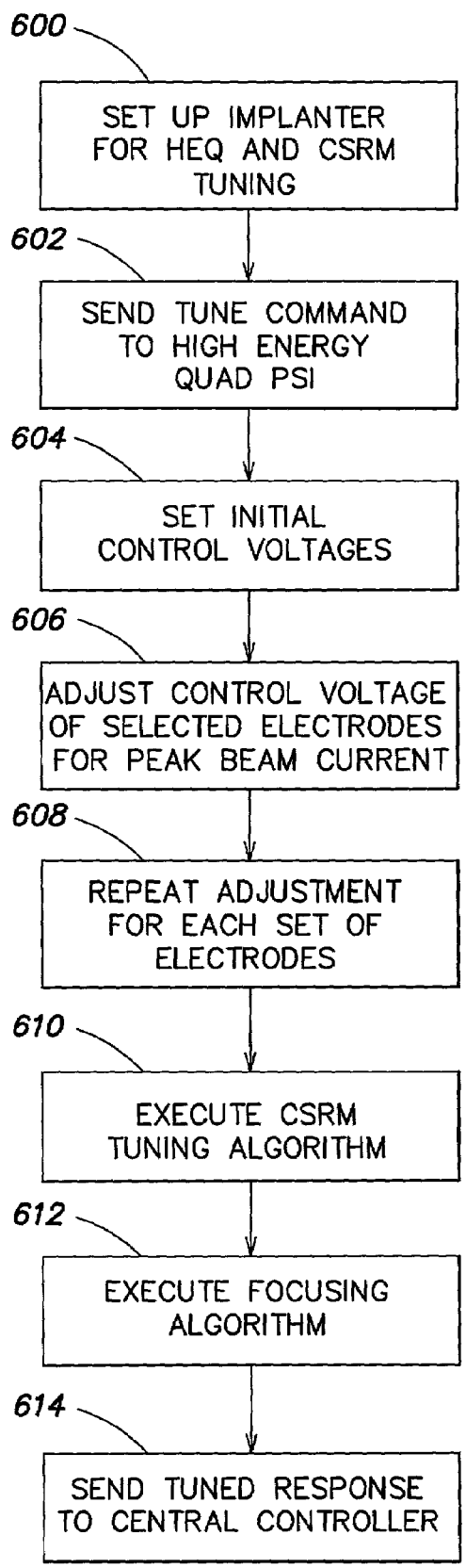
FIG. 16 is a flow chart of an embodiment of a program for execution by the power supply interface of FIG. 15.

In operation, as shown in FIG. 16, central controller 30 sets up the ion implanter for high energy quadrupole tuning and charge state resolving magnet tuning in step 600. The setup involves moving the high energy Faraday beam sensor 62 into position for beam sensing. In step 602, the central controller 30 sends a tune command to high energy quadrupole PSI 38. Approximate values of the control voltages for the selected beam profile are accessed in the system database and are sent to PSI 38. In step 604, PSI 38 sets initial control voltages in accordance with the approximate values transmitted from central controller 30. In particular, PSI 38 sets high energy quadrupole control voltages on lines 94 and a charge state resolving magnet control voltage on line 96. In step 606, the PSI 38 adjusts the control voltage of a selected set of electrodes of high energy quadrupole 22 for peak beam current. As described above in connection with the low energy quadrupole 18, the PSI 38 superimposes an AC component on the DC control voltage of a selected set of electrodes to provide a modulated control voltage. The high energy Faraday readback voltage is monitored as the quadrupole control voltage is modulated, and the control voltage is adjusted to the value which provides peak beam current. In step 608, the adjustment is repeated for each set of electrodes of high energy quadrupole 22.

In step 610, a charge state resolving magnet tuning algorithm is executed. The charge state resolving magnet 23 separates ions having different charge states by causing different deflections of ions according to charge state. The tuning algorithm for the charge state resolving magnet 23 corresponds to the tuning algorithm described above in connection with FIGS. 5 and 9. In this algorithm, the target component is the charge state resolving magnet 23, the target parameter is the charge state resolving magnet control voltage, the control component is a selected set of electrodes of high energy quadrupole 22 and the control parameter is the control voltage of the selected set of high energy quadrupole electrodes. The high energy quadrupole 22 is designed such that the selected set of electrodes produces a deflection of the ion beam in response to the control voltage. The deflection causes the ion beam to enter the charge state resolving magnet 23 at an entry angle that is a function of the beam deflection. The differing angles at which the ion beam enters charge state resolving magnet 23 cause the ion beam to exit from charge state resolving magnet 23 at different positions. The beam current varies as a function of entry angle. If the peak beam current occurs at an entry angle that differs from the desired entry angle, an adjustment to the charge state resolving magnet control voltage is determined. The determined adjustment is applied to the charge state resolving magnet, and the measurement is repeated. The tuning process is continued until the peak beam current occurs at the desired beam entry angle. In this tuning algorithm, the entry angle of the ion beam into the charge state resolving magnet 23 is the modulated control parameter.

Tuning the charge state resolving magnet 23 by modulating the control voltage on line 96 would be relatively time consuming, since magnet 23 has a relatively long response time and may take a substantial amount of time to stabilize once a change has been made to the control voltage on line 96.

To quickly tune the charge state resolving magnet 23, one of the control voltages supplied to the high energy quadrupole is modulated to simulate modulation of the charge state resolving magnet control voltage. Modulation of the high energy quadrupole control voltage causes deflection of the ion beam and a variation of the entry angle of the ion beam into charge state resolving magnet 23. Modulation of the high energy magnetic quadrupole 22 control voltage enables the PSI 38 to image the ion beam during the course of the modulation and to use the image to tune the charge state resolving magnet 23 as discussed above. In this context, modulating the high energy magnetic quadrupole control voltage on line 94 may be treated as equivalent to modulating the magnetic field of the charge state resolving magnet 23, since either modulation enables the PSI 38 to determine how a stronger or weaker magnetic field affects the ion beam 14. If the PSI 38 determines that the charge state resolving magnet is not tuned, it determines the direction in which the control voltage on line 96 should be adjusted and makes the appropriate adjustment.

In step 612, a focusing algorithm for focusing high energy quadrupole 22 is executed. The focusing algorithm involves application of a modulated control voltage to a selected set of electrodes of high energy quadrupole 22. The modulation causes the ion beam to sweep slowly across an aperture 106 between scanner entrance plates 108.

The high energy Faraday beam sensor 62 is located behind aperture 106 and thus detects the beam 14 only when the beam is not blocked by scanner entrance plates 108. Applicants determined that it is possible to relate the rate of change of the Faraday readback voltage to the spot size of the ion beam 14 at the aperture 106. Specifically, applicants determined that an ion beam with a smaller diameter transitions across the edge of the aperture 106 faster than an ion beam with a larger diameter, assuming a constant sweep rate. Accordingly, by searching for the largest first derivative of the readback voltage as the beam is swept across the Faraday beam sensor 62, it is possible to tune the control voltages of the high energy magnetic quadrupole 22 to minimize the spot size, and hence to focus the beam at the entrance to the scanner 24.

Figure 19:
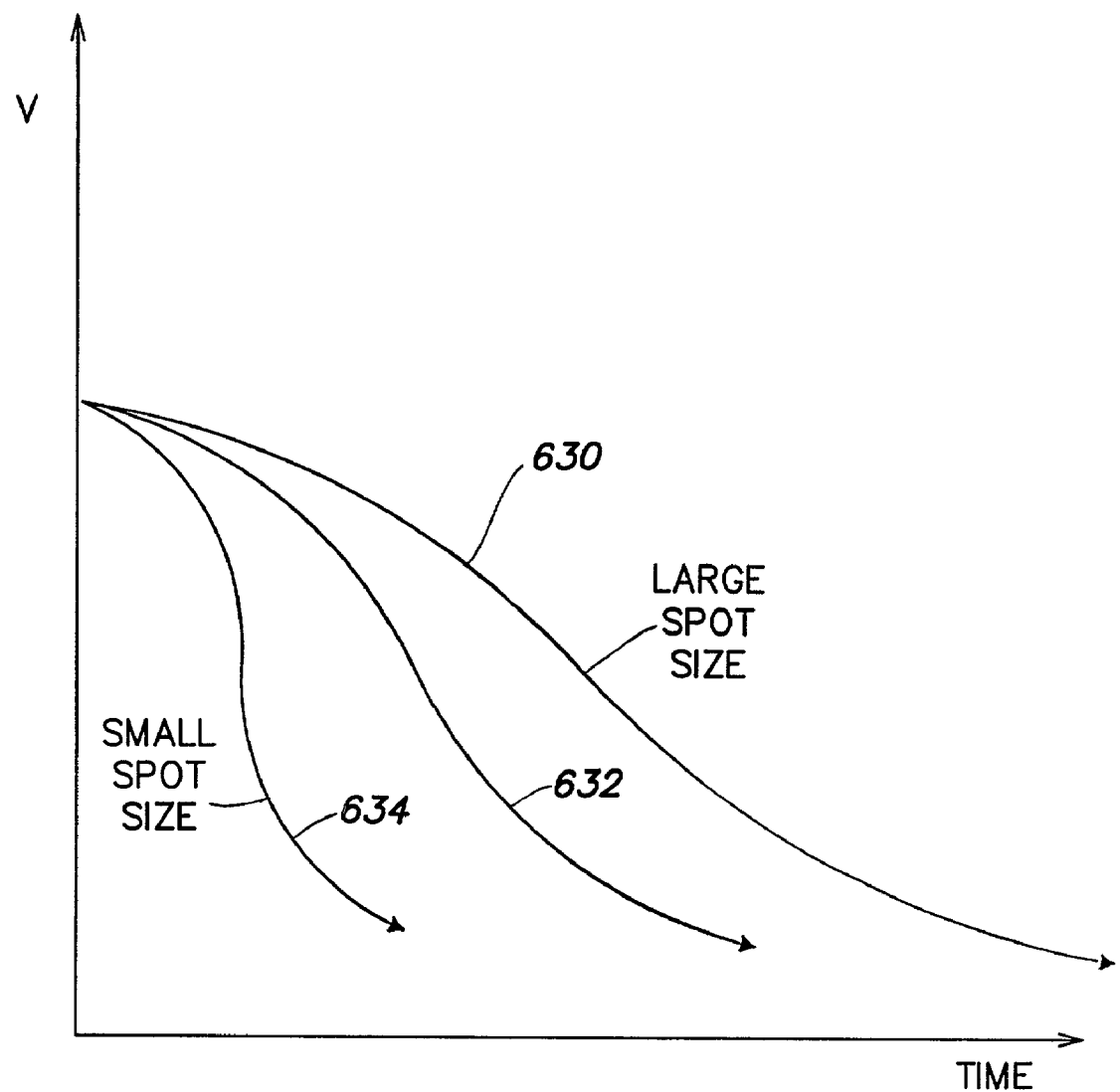
FIG. 19 is a graph of voltage as a function of time, illustrating Faraday readback voltage as the beam is deflected relative to an aperture for different beam sizes.

Examples of the Faraday readback voltage as a function of time, for different spot sizes, as the ion beam is swept across aperture 106 are illustrated in FIG. 19. Curves 630, 632 and 634 represent large, medium and small beam diameters, respectively. As illustrated, curve 634, which represents a small beam diameter, transitions quickly across the edge of aperture 106 and has the largest first derivative of the readback voltage.

After the focusing algorithm has been executed in step 612, the PSI 38 sends a tuned response to central controller 30 in step 614.

Figure 17:
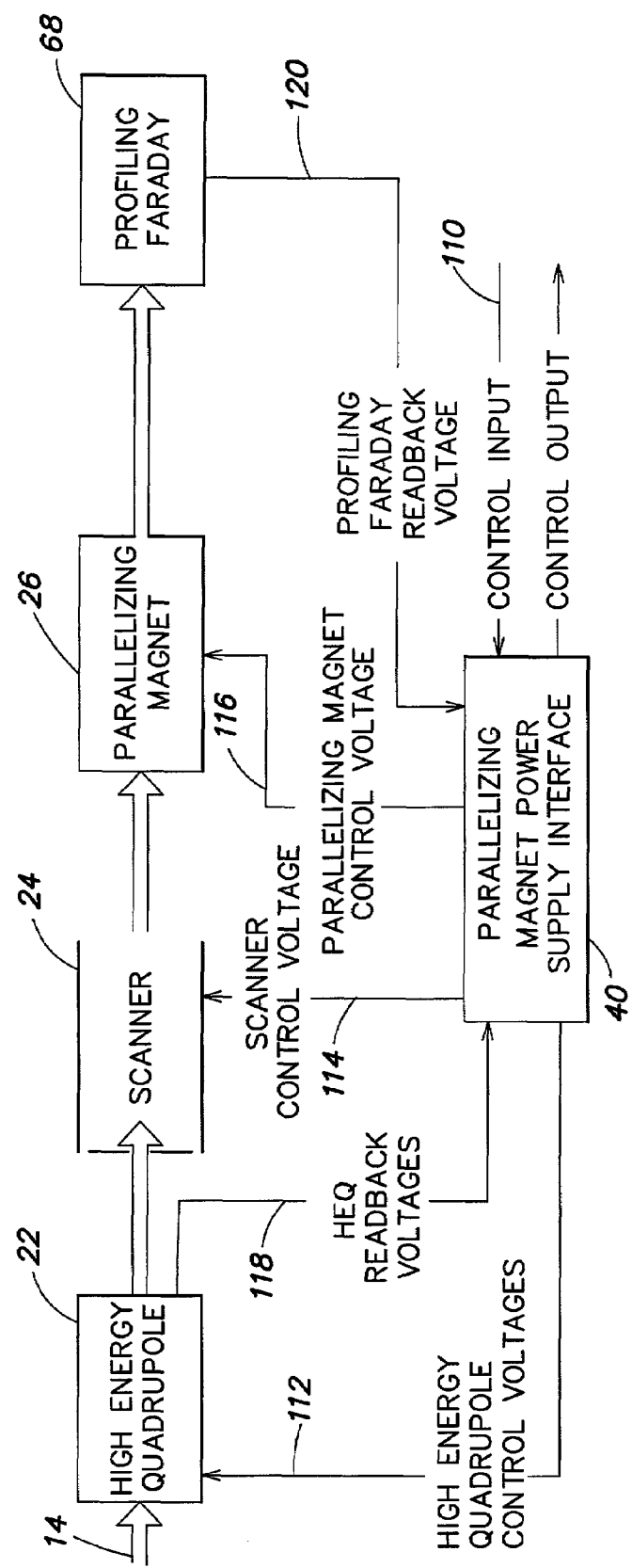
FIG. 17 is a block diagram of an embodiment a fourth power supply interface and a fourth subset of components in the ion implanter of FIG. 1.

Tuning of parallelizing magnet 26 and an optional final tuning of the high energy magnetic quadrupole 22 is now described with reference to FIGS. 17 and 18. As shown in FIG. 17, the parallelizing magnet power supply interface 40 receives a control input on line 110 and outputs control voltages to high energy magnetic quadrupole 22 on lines 112, a control voltage to scanner 24 on line 114, and a control voltage to parallelizing magnet 26 on line 116. The PSI 40 also receives high energy magnetic quadrupole readback voltages on lines 118 and a profiling Faraday readback voltage on line 120. The high energy quadrupole readback voltages represent the outputs of the high energy quadrupole power supplies, and the profiling Faraday readback voltage represents the beam current downstream of parallelizing magnet 26. A profiling Faraday beam sensor 68 is located in end station 28 and is preferably positioned at the center of its travel.

The PSI 40 tunes the parallelizing magnet 26 by deflecting the ion beam with the scanner 24 and monitoring the effects of deflection on the profiling Faraday readback voltage. Specifically, the parallelizing magnet 26 responds relatively slowly to changes in the control voltage on line 116, as compared to the response time of the scanner 24. Accordingly, it is faster to deflect the ion beam 14 with the scanner 24 to simulate modulation of the parallelizing magnet control voltage. The PSI 40 uses the readback voltage from the profiling Faraday beam sensor 68 to determine the direction in which the control voltage of the parallelizing magnet should be adjusted.

Figure 18:
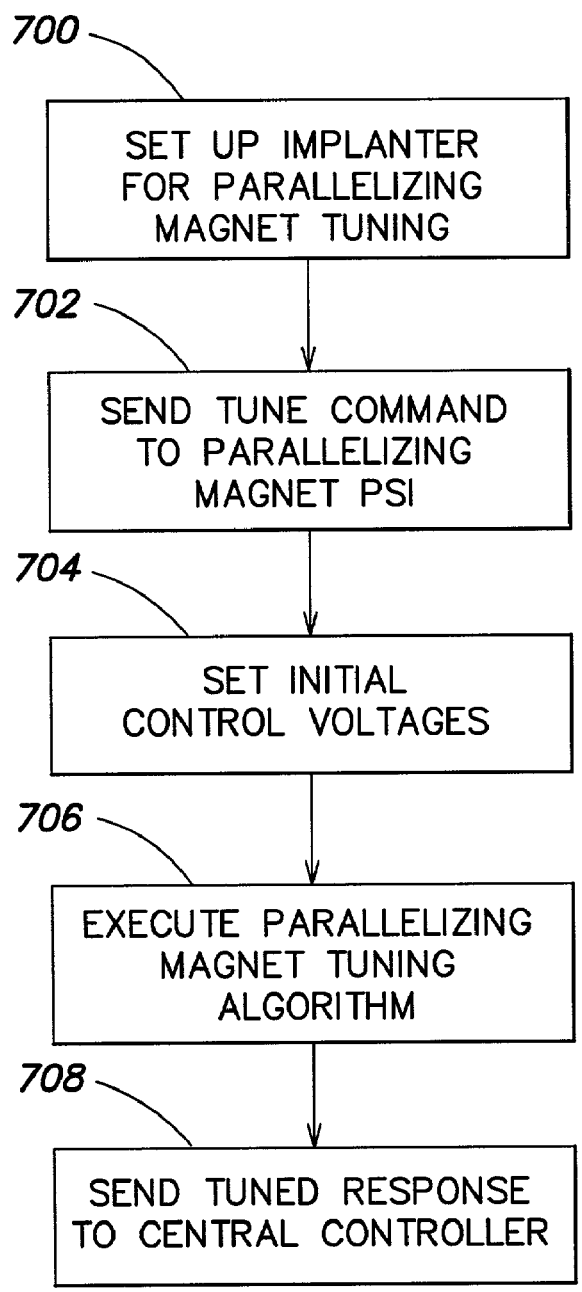
FIG. 18 is a flow chart of an embodiment of a program for execution by the power supply interface of FIG. 17.

In operation, as shown in FIG. 18, the central controller 30 sets up the ion implanter for tuning of parallelizing magnet 26 in step 700. This includes moving the profiling Faraday beam sensor 68 to the center of its travel. In step 702, the central controller 30 sends a tune command to parallelizing magnet PSI 40 with approximate values of the control voltages for the selected beam profile. In step 704, the PSI 40 sets the initial control voltages corresponding to the approximate values transmitted from central controller 30. In particular, PSI 40 sets initial high energy quadrupole control voltages on lines 112, a scanner control voltage on line 114, and a parallelizing magnet control voltage on line 116. The PSI 40 then executes a parallelizing magnet tuning algorithm in step 706. In particular, the scanner control voltage on line 114 is modulated to produce a deflection of ion beam 14. This causes the entry angle of the ion beam into parallelizing magnet 26 to vary in accordance with the deflection. The variation in entry angle produces a variation in the position of the ion beam at the output of parallelizing magnet 26. The profiling Faraday beam sensor 68 senses the beam and provides a Faraday readback voltage to PSI 40 as the beam is deflected by scanner 24. The deflection angle which produces peak beam current is used to determine a required adjustment to parallelizing magnet control voltage 116. The process is repeated until the peak beam current is obtained for a desired deflection of the ion beam by scanner 24.

The parallelizing magnet tuning algorithm is similar to the algorithm used for tuning the charge state resolving magnet 23, as described above. In particular, the magnet is the target component and the magnet control voltage is the target parameter. The control component is the scanner 24, which produces deflection of the ion beam in response to modulation of the scanner control voltage. In this algorithm, variation of the entry angle of the ion beam into the parallelizing magnet 26 is equivalent to varying the magnetic field of parallelizing magnet 26. However, the entry angle can be varied much more quickly than the magnetic field, thus permitting faster tuning. After completion of the parallelizing magnet tuning algorithm in step 706, the PSI 40 sends a tuned response to central controller 30 in step 708.

The preceding description has focused on an ion implanter and a method and apparatus for tuning an ion implanter. The invention is not limited in this regard, however, as the invention can be applied more broadly to tune any charged particle beam system.

Tuning Procedure

One embodiment of a tuning procedure is now described in more detail. The control system shown in FIG. 2 implements a specific procedure depending on the type of component being tuned. The tuning procedures implemented by the control system may be generally grouped, however, into three methods: image, search and spot size tuning.

The image method is used to tune slow-response components, such as magnets. In this method, an electrostatic component is modulated such that the beam is effectively "imaged" continuously while the magnet or other slow response component is adjusted to the correct setting (see FIG. 12).

One embodiment of an exemplary image is set forth in FIG. 10. As shown in FIG. 10, in the image tuning method, the control voltage applied to a control component, such as an electrostatic component, is varied and the response represented by the readback voltage, typically acquired by a Faraday beam sensor, is recorded during the modulation. This forms an "image" of the spatial distribution of the beam presented to the magnetic component. The control voltage of the magnetic component may be adjusted to bring the strongest portion of the beam into correct alignment out of the magnetic component.

The search method may be used to tune fast-response electrostatic components. In this method, the component being tuned is modulated to effectively "search" area surrounding the present value, and the center point of the modulation is adjusted toward the peak. This provides robustness against beam fluctuations, and can be implemented with the same tuning algorithm as the image method.

Spot size tuning may be used to tune the high energy magnetic quadrupole 22 and any other component that affects beam focus. Whereas the search and image methods seek to maximize beam current, this step also monitors the beam spot size. Tuning of this parameter is accomplished by evaluating the sharpness of the beam focus, as indicated by the first derivative of the beam current as a function of beam position.

Within this generalized framework, the control system must make specific measurements and draw from these measurements conclusions regarding optimal parameters for tuning the beam 14. Several aspects of the manner in which the control system arrives at its conclusions are now described.

Entry Conditions

The control system starts the tuning process by establishing certain initial conditions. For example, when there is no beam, or when the beam is unstable due to a rising temperature or changing species, tuning cannot be conducted. In general, it is assumed that the implanter is running a stable beam, and that the control system has initialized the beamline control parameters to values that are approximately correct for the given implant process to be affected.

Of course, it is not expected that the control system can initialize the beamline to fully tuned values. In that case, tuning would be unnecessary. The term "approximately correct," in this context, therefore, means that for each component that is tuned, there is a certain capture range—if the difference between the initial value and the tuned value is within this range, tuning can be accomplished. In general, the control system accepts parameters that are adjusted to create an appropriate capture range.

Firmware Parameters

The modulation tuning procedure disclosed herein is an iterative process, wherein a core algorithm is repeated until tuning is complete. Each iteration, essentially, is an independent process. During each iteration, the process collects data, analyzes the data, and adjusts the tuning. Specifically, a control parameter is varied through a series of steps (both above and below a nominal value), the beam current is monitored, and relevant data is stored. At the end of the cycle, the stored data is analyzed to determine how the target parameter should be adjusted. Finally, the target parameter is adjusted towards its tuned value.

Various conditions must be accounted for in each iteration. For example, there are phase lags in some hardware, most notably the power supplies. These phase lags may disrupt the purity of the algorithm, in that a control parameter modulation from one cycle may actually fall into the period of the following cycle. This is generally a minor issue, since all cycles involve such modulations, and the algorithm depends upon readbacks (not commands) to determine how a power supply is actually functioning.

Likewise, data from a single cycle may be insufficient to declare that the device is optimally tuned. Therefore, data from a number of cycles may be collected and correlated with preceding cycle(s) or immediately preceding cycle(s) to confirm a provisional success.

Finally, as the tuning process proceeds, the target component is adjusted closer to a tuned condition. In one embodiment, the cycle-level parameters are altered at this stage. Early cycles, in this embodiment have a broad capture range, to be able to discriminate against false peaks, and simply try to place the peak into a central area so that the region examined can be reduced. Later cycles, in this embodiment, have a smaller capture range, depending upon an input condition where the target component is nearly tuned, and pay special attention to end conditions that indicate optimal tuning.

Data Collection

The primary factors affecting the data collection phase include the shape and speed of the control parameter modulation. It is assumed that readbacks of the beam current and the true value of the control parameter are performed as frequently as possible, within firmware constraints, so no readback parameter need be transmitted from the central controller 30 to the power supply interface, although a readback frequency parameter could be included, if desired.

In general, any desired wave shape may be used in connection with the control parameter modulation. However, since it is generally undesirable to produce a rapid change in any parameter, a gradual back-and-forth variation about the nominal value is preferred. This may be a sine wave, a triangle wave, or a similar wave shape. A triangle wave is currently envisioned as optimal, since it minimizes the maximum rate of change of the control parameter.

Since there is no special need for a particular wave shape, in one embodiment, the software is configured to generate its own sequence of control parameter voltages, given the desired amplitude of the control parameter modulation. In another embodiment, to maximize flexibility without introducing a large number of parameters, an adjunct parameter is used to specify, by enumeration, what general type of curve shape is desired from a predetermined set of options (sine, triangle, ramp-then-drop, etc.).

The speed of the control parameter modulation, unlike the shape, however, is generally important. If the modulation is too fast in relation to the amplitude, the power supply driving the control parameter may not be able to keep up. If the modulation is too fast in relation to a firmware limit of how rapidly control parameter changes can be commanded, the command parameter curve may be ragged. If the modulation is too fast in relation to how rapidly the beam current readback is sampled, there may be gaps in the resulting beam image, resulting in data collection that misses the true peak. Conversely, if the modulation is too slow, the entire tuning process may be unacceptably slow.

Two types of speed variables are involved. One variable is the duration of an entire cycle, while the other is the interval between control parameter commands. If it is assumed that commands may be sent at a firmware-dictated limit, then the algorithm may automatically create a step sequence of the appropriate granularity, given a desired cycle period. In this case, the only speed parameter is the cycle period. Some factors bounding acceptable values are dependent upon the firmware's operating speed (e.g. readback rate), while others are dependent upon physical time (e.g. power supplies).

Data Analysis

In the data analysis phase, the PSI determines whether the target parameter is too high, too low, or within an acceptable range. Various aspects of the data analysis phase, such as optimization, determining whether the target parameter is close enough, and error detection are now discussed.

Optimization

Initially, the PSI must determine a value for the optimal control parameter setting. One approach is to record the control parameter readback that corresponds to the highest beam current that was observed.

A potential problem with this approach is that it may not allow for end-case discrimination. The peak may not be in a single defined control parameter setting—there may be a flat plateau with optimal beam current over a range, and the tuning procedure may make it desirable to find the center of that range. Simply choosing the best observed beam current draws the process towards a random point in this plateau on each cycle. If the algorithm is asked to tune at a level of fineness where it observes a plateau, these phantom pulls cause the algorithm to enter an endless fine-tuning chase towards the ever-moving "best" point on the plateau.

In one embodiment, to address this issue, the control parameter readbacks from all readings that show near-optimal beam currents are averaged. This method aims towards the center of the plateau. This requires a parameter declaring what constitutes near-optimal, as a fraction of the peak observed beam current during that cycle. Conceptually, this parameter may be considered a threshold relating to the plateau height. To return to the simple case of driving toward the single best beam current observation, this parameter can be set to 100 percent and only the peak reading is used.

When part, but not all, of the plateau is visible (because the control parameter modulation takes the beam off one edge of the plateau, but not the other), the averaging technique still yields the correct result regarding the direction of the optimal setting for the target parameter. Specifically, if only one edge of the plateau is visible, the target is clearly not tuned to the center of the peak, since a symmetrical variation of the control parameter reaches only one edge of the plateau. The center point, in this situation, is away from the visible edge of the plateau.

Once the optimal control parameter setting has been determined, it is necessary to determine whether the target parameter is too high or too low. This depends upon a polarity indicating the sign relationship between variation of the control parameter and the corresponding effect on the beam.

Determining "Close Enough"

In connection with determining the optimal control parameter, it is necessary to determine whether the target parameter is close enough to the correct tuning. If there is a direct and reliable relation between the control parameter and the beam current, one parameter is sufficient to indicate how close is close enough. This can be provided either as a count, for example, of units of control parameter variation or as a fraction of the full control parameter modulation range.

There are complicating factors, however. First, the beam current is noisy, and it may be necessary to demonstrate that the "close enough" condition is reliable across several cycles with the target parameter unchanged. Second, as noted above, there may be a flat plateau with optimal beam current over a range. Third, with some parameters, it is not really ideal to land on the center of the peak, but it is preferred to shift toward one side of the peak. The first of these issues implies some statistically driven parameter, while the second and third require some assumptions about the possible curve shapes that might be encountered.

The simplest approach to the statistical issue is to require a series of consecutive readings to all indicate "close enough." More elaborate methods might allow for occasional readings falling outside this window (such as a 3-of-4 voting rule). There is, however, a complication with methods that allow out-of-bounds results from a cycle. Specifically, if a cycle shows not close enough, the normal response of this algorithm is to command an adjustment to the target parameter. Since the target component is now tuned differently, prior readings are no longer directly relevant to a statistical determination of the accuracy of the new tuning. Therefore, a statistical approach that considers readings outside the "close enough" range must inhibit tuning operations while voting is in progress.

A consecutive-reading approach may be viewed as a base case of this voting method, something like a 3-of-3 rule. Under this approach, a single out-of-bounds cycle causes tuning to resume. Therefore, it may be advantageous to incorporate a voting method into the firmware to allow maximum flexibility.

Error Detection

A few types of errors may be considered for trapping. For example, in some situations, a false peak may appear in the readback voltage. A false peak represents a peak in the beam current due to the charged particle beam system being tuned to an undesired isotope or element. If the true peak is higher than the false peak (by enough margin that the false peak is below the plateau height threshold), then the false peak is simply ignored. But if the true peak is lower than the false peak, something is needed to eliminate the false peak. Optionally, judicious selection of parameters and starting conditions may prevent the false peak from being detected by the PSI. In other situations, however, more elaborate procedures are required to remove the false peak.

In one embodiment, the false peak is removed by triggering an early termination of voting upon a cycle with a badly out-of-bounds result. This is an extension of the basic method, described above, which ignores the magnitude of the result from each cycle; but rather simply determines whether the result is within bounds, or out of bounds. To implement this method, a parameter (with units similar to the "close enough" threshold parameter) is provided specifying, if a cycle is outside a particular range, that voting terminates and the process reverts to tuning.

In another embodiment, the shape of the curve (beam current vs. control parameter) is provided with additional definition, both with respect to the type of curve that might be encountered, and in how the algorithm responds to these conditions to efficiently and accurately tune the implanter. Specifically, in such situations, the correct tuning may not be toward the optimal beam current, or at the center of a plateau, but offset from this location.

Tuning Adjustment

Once the data analysis phase has determined how (and if) the target parameter should be adjusted, the final step is to actually adjust the target parameter toward a correct tuning. One issue is the magnitude of the change that should be commanded.

It may not be easy, or even possible, to calculate from the available data the magnitude of the necessary tuning change. However, it is generally fast and possible to determine the direction in which to adjust the target parameter to approach its optimal value.

At a given point in the tuning process—e.g., at a given cycle—there is generally a relationship between the range swept with the control parameter and the compensatory scale of adjustment anticipated for the target parameter. This knowledge may be stored externally, and generally need not be conveyed to the firmware. Accordingly, in one embodiment, the firmware is provided with a desired step size of the target parameter. If tuning is indicated by the data analysis, the target parameter is adjusted by the step size in the indicated direction.

The invention is not limited to using a set step size, however, as some higher degree of intelligence may be employed. For example, if the data analysis indicates that the target is just outside the "close enough" range, a smaller change in the target parameter may be desirable. There are two basic approaches to this estimation. One is to have several "bins" with different values for the magnitude by which the target parameter is adjusted; the other is to have a linear or polynomial function by which a magnitude is calculated. If desired, both methods may be made available. In any of these methods, the magnitudes of positive and negative changes need not be symmetric.

Slew Rate of Target Parameter

The preceding sections focused on the magnitude of the target parameter changes, without addressing the rate at which these changes are commanded. As with the control parameter, there is an upper limit for the speed at which the target parameter may be adjusted.

It is desirable for the control parameter to continue cycling throughout the tuning process to minimize time varying effects, such as delays in the power supply. Additionally, a modulation waveform that abruptly starts and stops may be awkward to utilize if there is a phase shift. Further, the power supply may respond poorly to such input.

Since the algorithm uses information from one cycle to learn how the target parameter must be adjusted, it is assumed that the target parameter is adjusted once per cycle. If that is too fast, then one solution is to simply slow down the cycles so that they take longer. One adverse consequence of a slower cycle is that tuning takes longer. This should not be a limiting consideration, however, if the reason the speed is limited is a limitation on the speed at which the target parameter may be adjusted. Therefore, in a preferred embodiment, it is not necessary to include an independent parameter for the speed at which the target parameter is adjusted.

Multiple Cycles

The above consideration has focused on the level of individual tuning cycles. Full tuning, however, is an iterative process across many cycles. The cycle-level parameters may change during a tuning sequence as finer levels of granularity are used. As discussed above, the tuning command by the central controller 30 initiates a multi-cycle tuning process, during which the firmware in the PSI is essentially autonomous. It is therefore necessary for the firmware to determine the appropriate cycle-level parameters for each phase of tuning.

In a preferred embodiment, tuning is a sequence of discrete phases, each phase based upon an entry condition, an exit condition, and a tuning strategy. The entry condition relates to the "capture range" that is needed—how badly tuned the target component may be at the start of that phase. The exit condition relates the required tuning accuracy at that phase (early phases need only be within the capture range of the next phase, while the final tuning must be operationally satisfactory). The strategy is expressed in the range of parameters selected to progress from the entry state to the exit state.

In one embodiment, where a small number of phases is anticipated, i.e.,—between about one and ten, the firmware may be an array of parameters, with one element for each phase.

Failure Response

Tuning attempts sometimes fail. The system is able to detect failures, to respond appropriately with a second tuning attempt, and to report failures to the central controller 30 if the beam is not optimized.

Even if the beam is found, the tuning process may fail for a number of reasons:

1) Power supplies may not be stabilized easily. As a result, a tuned beam may drift out-of-tune in the seconds following a tuning "success." In this case, the tuning process should be made slower, such as by lengthening the cycle time, or variations should be made less extreme, i.e., the amplitude of the control parameter modulation should be reduced, or the magnitude of the target parameter adjustment should be reduced.

2) The algorithm may, for some reason, wander away from the beam. If the algorithm is within the "capture range" for the current level of granularity, then it is generally possible to recapture the beam. However, if the beam has left the capture range, the system will react as if the beam is not found.

3) The algorithm may prematurely declare tuning complete. In this case, the "termination condition parameters" for ending the last tuning iteration are inadequate.

4) The system may find the false peak and optimize to that peak.

In one embodiment, an expected minimum beam current parameter is used to reduce the risk of finding the false peak or tuning within noise. The minimum current parameter tells the algorithm what kind of signal to expect. If the minimum beam current is not detected, then something is wrong enough to prevent tuning. The initial state of the machine may be outside the "capture range" of the tuning algorithm, or the beam may simply not be present.

To allow some reaction to no beam current, in one embodiment, the tuning algorithm may attempt a broader tuning sweep in this situation, since this type of error generally indicates that the beam is outside the range of the current tuning phase. Since this error may be encountered at any phase, it is most reasonable (except in the very first phase, when this is impossible) to simply revert to the first tuning phase. This allows the system to take a wider view, and appropriately governs the behavior of the system during the broader search. Optionally, if this error occurs in the first phase, an ordinarily-skipped "zero phase" with an exceptionally broad range can be attempted.

In an alternative embodiment, the step of evaluating the present tuning of the ion beam (step 230 in FIG. 4) may comprise a Fourier analysis of the beam current readback. Modulation of the control parameter induces a modulation of the beam current downstream from the control parameter. If the beamline is correctly tuned, the beam current waveform will have regular peaks at the frequency of the control parameter modulation. However, if the beamline is incorrectly tuned, then the beam current waveform will have a "double bump" pattern that will introduce an impurity into the frequency spectrum of the beam current readback, including a high frequency component produced by the interval between these two peaks. These frequency impurities indicate incorrect tuning of the target parameter. A frequency analysis of these impurities, combined with knowledge of the specific waveform employed, may be used to determine whether the target parameter should be increased or decreased to improve tuning.

Tune Command

The tuning process is initiated by a single command containing parameters, discussed above, that enable the PSI to tune the beam. In an exemplary tuning command, a first data structure is transmitted, comprising several cycle independent parameters such as:
1) Minimal beam current;
2) Target parameter–minimum value;
3) Target parameter–maximum value;
4) Control parameter–minimum value; and
5) Control parameter–maximum value.

In addition, as a sixth element, the first data structure may include an array of a second data structure, with one array element for each tuning phase. This second data structure may comprise parameters such as:
1) Amplitude of control parameter modulation.
2) Type of control parameter modulation waveform.
3) Control parameter modulation cycle period.
4) Polarity of relationship used to determine sign of tuning required.
5) Plateau height threshold, for selecting data used to find averaged center of peak.
6) "Close Enough" threshold, for determining adequate tuning for terminating a phase.
7) Target Adjustment Magnitude for extreme positive off-peak condition.
8) Target Adjustment Magnitude for near-center condition.
9) Target Adjustment Magnitude for extreme negative off-peak condition.
10) Voting Termination Threshold, for detection of unreliable data for declaring success.
11) Number of trials that must be "close enough" to declare success.
12) Number of trials within which the preceding value must be achieved.

These lists of parameters are not exhaustive, as additional parameters may be desired or required, depending on the protocol or configuration of the control system and the particular hardware or firmware used. For example, additional parameters may be required to specify I/O lines, or to make the interrelationship between the hardware and firmware flexible.

Tuning Confirmation

In a standard application for an ion implanter, silicon wafers are sequentially presented to the beamline as wafer 27 (FIG. 1) for an ion implant process. Over an extended time, drift in beamline components may cause a correctly tuned beam to become slightly mistuned. To ensure proper quality, it may be desirable to periodically evaluate the beam tuning, to detect any developing mistuning before processing additional wafers.

It may be desirable to evaluate beam tuning without initiating a standard tuning process. Beam evaluation can be performed much more rapidly than beam tuning, and so evaluations can be performed more frequently during wafer processing without impacting wafer throughput. If the beam is found to be sufficiently mistuned, it is desirable to alert the operator, suspend wafer processing, and optionally initiate a full beam tuning procedure.

To evaluate the beam for this purpose, a portion of the full tuning method may be used. Specifically, the target parameter may be modulated about its initial value, and then restored to that value, while the beam current is sampled downstream of the control component. The standard beam evaluation procedure, used at the end of the tuning process to confirm that the beam is correctly tuned, may be used to evaluate the beam quality.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method for evaluating the tuning of a target parameter of a target component in a charged particle beam system, wherein a charged particle beam is transported through said target component comprising the steps of:
   (a) varying a control parameter of a control component located upstream of the target component, wherein said control parameter has a predetermined relation to said control component;
   (b) measuring beam current downstream of said target component in said charged particle beam system as said control parameter is varied; and
   (c) evaluating the tuning of said target parameter based on the beam current measurements and the predetermined relation between the target component and the control parameter.

2. A method as defined in claim 1, wherein the step of evaluating the tuning of said target parameter comprises determining whether the beam current is at least a predetermined fraction of theft maximum observed beam current when said control parameter is at its initial value.

3. A method as defined in claim 2, further comprising the step of performing two or more iterations of all steps until a predetermined voting criteria is reached.

4. A method as defined in claim 3, wherein said predetermined voting criteria comprises the beam current exceeding a predetermined fraction of the maximum observed beam current, in at least a predetermined number of iterations.

5. A method as defined in claim 1, wherein the step of evaluating the tuning of said target parameter comprises determining whether maximum beam current is measured when said control parameter is offset above or below its initial value.

6. A method as defined in claim 1, wherein the step of evaluating the tuning of said target parameter comprises determining whether said target parameter is tuned to a higher or lower value than would result in maximum beam current measured downstream from said target parameter, based upon the beam current measurements and the predetermined relation between said target component and said control parameter.

7. A method as defined in claim 1, further comprising the step of adjusting said target parameter based upon the evaluation of the tuning of said target parameter.

8. A method as defined in claim 7, further comprising the step of performing two or more iterations of all steps until the measured beam current meets a predetermined criteria.

9. A method as defined in claim 8, wherein the variation in magnitude of said control parameter is smaller during an iteration than in a preceding iteration.

10. A method as defined in claim 8, wherein said predetermined criteria constitutes the beam current being at least a predetermnined fraction of a maximum observed beam current when said control parameter is at its initial value.

11. A method as defined in claim 7, wherein the step of adjusting said target parameter comprises analyzing the beam current measurements to determine a target parameter adjustment and adjusting said target parameter by the determined target parameter adjustment.

12. A method as defined in claim 11, Wherein the step of analyzing the beam current measurements comprises determining a target parameter adjustment direction and magnitude to shift a peak beam current toward a required value of said control parameter.

13. A method as defined in claim 1, wherein said target component comprises a market which generates a magnetic field in response to a current, and wherein said target parameter comprises the approximate current supplied to said magnet.

14. A method as defined in claim 13, wherein the control component comprises an electrostatic component which genetates an electric field in response to a control voltage and wherein the step of varying the control parameter comprises varying the control voltage.

15. A method as defined in claim 13, wherein said control parameter comprises an approximate entry angle of the charged particle beam into said magnet.

16. A method as defined in claim 13, wherein said control parameter comprises an approximate entry velocity of the charged particle beam into said magnet.

17. A method as defined in claim 13, wherein said target component comprises a bending magnet of a mass analyzer.

18. A method as defined in claim 13, wherein said target component comprises a charge state resolving magnet.

19. A method as defined in claim 13, wherein said target component comprises a parallelizing magnet for converting trajectories of said beam into substantially parallel trajectories.

20. A method as defined in claim 1, wherein said target component comprises an electrostatic component which generates an electric field in response to a voltage, and wherein said target parameter comprises the approximate voltage applied to said electrostatic component.

21. A method as defined in claim 1, wherein said control parameter comprises the approximate value of a power supply output feeding said control component.

22. A method as defined in claim 21, further comprising the step of measuring the value of said power supply output during the variation of said control parameter.

23. A method as defined in claim 22, further comprising the step of determining a secondary value of said power supply, within the range of values bounded by extreme members of a set comprising at least one measurement of said control parameter recorded nearly simultaneously with at least one measurement of said beam current at least a predetermined fraction of a peak observed beam current.

24. A method as defined in claim 23, further comprising the steps of reading a nominal control parameter readback value prior to initiating the variation of said control parameter; and adjusting said target parameter from its initial value by a predetermined function of the signed difference between said secondary value of said power supply and said nominal control parameter readback value.

25. A method as defined in claim 1, wherein the step of varying said control parameter comprises modulating the control parameter with a periodic waveform.

26. A method as defined in claim 1, wherein the step of varying said control parameter comprises stepping the control parameter through a predetermined pattern of discrete values.

27. A method as defined in claim 1, wherein said control parameter comprises the approximate value of a power supply output feeding said control component.

28. A method as defined in claim 27, wherein the step of varying said control parameter comprises stepping the control parameter through a predetermined pattern of discrete values more rapidly than said power supply output can stabilize in response to each setting.

29. A method as defined in claim 1, wherein the step of measuring beam current comprises measuring beam current with a Faraday beam sensor located downstream of said target component.

30. A method as defined in claim 1, wherein the step of measuring beam current comprises measuring beam current with a parametric current transformer located downstream of said target component.

31. A method as defined in claim 1, wherein the step of measuring beam current comprises measuring beam current samples for different values of said control parameter.

32. A method as defined in claim 1, further comprising the step of restoring said control parameter to its initial value.

33. A method as defined in claim 32, wherein said control parameter responds to adjustment more rapidly than said target component responds to adjustment.

34. A method as defined in claim 1, wherein the step of evaluating said target parameter comprises performing a Fourier analysis on a waveform of the measured beam current.

35. A method as defined in claim 1, wherein said charged particle beam system comprises an ion implanter.

36. A method as defined in claim 1, wherein said charged particle beam system comprises a particle accelerator.

37. A method as defined in claim 1, wherein said charged particle beam system comprises a mass spectrometer.

38. A method for tuning a target parameter of a target component in a charged particle beam system, wherein a charge particle beam is transported through said target component, comprising the steps of:
  (a) determining a nominal target parameter value;
  (b) measuring a nominal readback value of said target parameter;
  (c) varying said target parameter in a predetermined pattern about said nominal target parameter value;

(d) measuring the beam current downstream of said target component in said charged particle beam system, and the target parameter readback value of a power supply output, as said target parameter is varied;

(e) determining an optimal readback value, within the range of values bounded by extreme members of a set comprising at least one measurement of said target parameter readback value recorded nearly simultaneously with at least one measurement of said beam current at least a predetermined fraction of a peak observed beam current;

(f) adjusting the nominal target parameter value by a predetermined function of the signed difference between said nominal readback value and said optimal readback value; and (g) performing tow or more iterations of at least steps (b), (c), (d) and (e) until said beam current measurements meet a predetermined criteria.

39. A method as defined in claim 38, wherein the variation in magnitude of said target parameter is equal or smaller during an iteration than in a preceding iteration.

40. A method as defined in claim 38, wherein said predetermined criteria constitutes beam current being at least a predetermined fraction of a maximum observed beam current when the absolute difference between said optimal readback value and said nominal readback value is smaller in magnitude than a predetermined threshold.

41. A method as defined in claim 38, wherein said target component comprises an electrostatic component which generates an electric field in response to a voltage, and wherein said target parameter comprises the approximate voltage applied to said eletrostasic component.

42. A method as defined in claim 38, wherein the step of varying said target parameter comprises modulating the target parameter with a periodic waveform.

43. A method as defined in claim 38, wherein the step of varying said target parameter comprises stepping the target parameter through a series of discrete values.

44. A method as defined in claim 38, wherein said target parameter comprises the approximate value of a power supply output feeding said target component.

45. A method as defined in claim 44, wherein the step of varying said target parameter comprises stepping the target parameter through a series of discrete values more rapidly than said power supply output can stabilize in response to each setting.

46. A method as defined in claim 38, wherein the step of measuring beam current comprises measuring beam current with a Faraday beam sensor located downstream of said target component.

47. A method as defined in claim 38, wherein the step of measuring beam current comprises measuring beam current with a parametric current transformer located downstream of said target component.

48. A method as defined in claim 38, wherein the step of measuring beam current comprises measuring beam current samples for different values of said target parameter.

49. A method as defined in claim 38, wherein the step of adjusting the nominal target parameter value comprises performing a Fourier analysis on a waveform of the measured beam current.

50. A method as defined in claim 38, wherein said charged particle beam system comprises an ion implanter.

51. A method as defined in claim 38, wherein said charged particle beam system comprises a particle accelerator.

52. A method as defined in claim 38, wherein said charged particle beam system comprises a mass spectrometer.

53. A method for evaluating the tuning a target parameter of a target component in a charged particle beam system, wherein a charge particle beam is transported through said target component, and said target parameter determines the approximate downstream focus of said charged particle beam, comprising the steps of:

(a) determining a nominal target parameter value, wherein said target parameter determines an approximate position of said charged particle beam at the plane of a beam current sensing device located downstream from said target component within said charged particle beam system;

(b) varying said target parameter in a predetermined pattern about said nominal target parameter value, such that said charged particle beam is alternately incident on and not incident on said beam current sensing device;

(c) measuring beam current with said beam current sensing device, as said target parameter is varied;

(d) determining the sharpness of the transition between said charged particle beam being incident on and not incident on said beam current sensing device; and (e) evaluating the tuning of said target parameter based at least in part on said sharpness.

54. A method as defined in claim 53, wherein the step of determining sharpness constitutes determining the derivative of beam current as a function of said target parameter as said charged particle beam is passed across an edge of said beam current sensing device.

55. A method as defined in claim 53, wherein the step of evaluating the tuning of said target parameter further comprises evaluating a predetermined function, taking as inputs at least said sharpness and a maximum observed beam current.

56. A method as defined in claim 53, comprising performing two or more iterations of at least steps (b), (c), (d) and (e) until the evaluated tuning of said target parameter meets a predetermined criteria.

57. A method as defined in claim 56, wherein the variation in magnitude of said control parameter is equal or smaller during an iteration than in a preceding iteration.

58. A method as defined in claim 56, wherein said predetermined criteria constitutes beam current being at least a predetermined fraction of a maximum observed beam current when the absolute difference between said target parameter and said nominal target parameter value is smaller in magnitude than a predetermined threshold.

59. A method as defined in claim 53, wherein said target component comprises an electrostatic component which generates an electric field in response to a voltage, and wherein said target parameter comprises the approximate voltage applied to said electrostatic component.

60. A method as defined in claim 53, wherein the step of varying said target parameter comprises modulating the target parameter with a periodic waveform.

61. A method as defined in claim 53, wherein the step of varying said target parameter comprises stepping the target parameter through a series of discrete values.

62. A method as defined in claim 53, wherein the step of varying said target parameter comprises stepping the target parameter through a series of discrete values more rapidly than said target parameter can stabilize in response to each setting.

63. A method as defined in claim 53, wherein the step of measuring beam current comprises measuring beam current with a Faraday beam sensor located downstream of said target component.

64. A method as defined in claim 53, wherein the step of measuring beam current comprises measuring beam current with a parametric current transformer located downstream of said target component.

65. A method as defined in claim 53, wherein the step of measuring beam current comprises measuring beam current samples for different values of said target parameter.

66. A method as defined in claim 53, wherein said charged particle beam system comprises an ion implanter.

67. A method as defined in claim 53, wherein said charged particle beam system comprises a particle accelerator.

68. Apparatus for evaluating the tuning a target parameter of a target component in a charged particle beam system, wherein a charge particle beam is transported through the target component, comprising:
  means for varying a control parameter of a control component located upstream of the target component, wherein said control parameter has a predetermined relation to the target component;
  means for measuring beam current downstream of the target component as the control parameter is varied; and
  means for evaluating the tuning of the target parameter based on the beam current measurements and the predetermined relation between the target component and the control parameter.

69. Charged particle beam apparatus comprising:
  a target component controlled by a target parameter;
  a control component controlled by a control parameter and located upstream of the target component;
  a beam sensor located downstream of the target component for sensing a charged particle beam transported through the control component and the target component; and
  a controller for varying the control parameter and evaluating the tuning of the target parameter in response to beam current measurements received from the beam sensor, based on the predetermined relation between the target component and the control parameter.

70. A charged particle beam system comprising:
  one or more beamline components through which a charged particle beam is transported;
  a centralized controller for controlling the system; and
  at least one localized controller containing a tuning algorithm for automatically tuning a selected one of said one or more beamline components in response to a tune command from said centralized controller.

71. A method for adjusting the focus of a charged particle beam, comprising the steps of:
  (a) deflecting the charged particle beam across an edge of an aperture;
  (b) determining the rate of change of beam current downstream of the aperture as the beam is deflected across the edge of the aperture;
  (c) repeating steps (a) and (b) for different focus settings of the charged particle beam; and
  (d) selecting the focus setting which gives the highest rate of change of beam current downstream of the aperture as the beam is deflected across the edge of the aperture.

72. In a charge particle beam system comprising a plurality of beamline components though which a charged particle beam is transported, a centralized controller and one or more power supply controllers for controlling individual ones of said beamline components, a tuning method comprising the steps of:
  sending a tune command from said centralized controller to a selected one of said power supply controllers; and
  automatically executing a tuning algorithm by the selected one of said power supply controllers in response to the tune command.

* * * * *